(12) United States Patent
Ledentsov et al.

(10) Patent No.: US 7,031,360 B2
(45) Date of Patent: Apr. 18, 2006

(54) TILTED CAVITY SEMICONDUCTOR LASER (TCSL) AND METHOD OF MAKING SAME

(75) Inventors: Nikolai Ledentsov, Berlin (DE); Vitaly Shchukin, Berlin (DE)

(73) Assignee: NL Nanosemiconductor GmbH, Dortmund (DE)

( * ) Notice: Subject to any disclaimer, the term of this patent is extended or adjusted under 35 U.S.C. 154(b) by 263 days.

(21) Appl. No.: 10/074,493

(22) Filed: Feb. 12, 2002

(65) Prior Publication Data

US 2003/0152120 A1 Aug. 14, 2003

(51) Int. Cl.
*H01S 5/00* (2006.01)

(52) U.S. Cl. .............................. 372/43; 372/20; 372/45; 372/98; 372/99

(58) Field of Classification Search .................. 372/20, 372/43, 45, 50, 98, 99
See application file for complete search history.

(56) References Cited

U.S. PATENT DOCUMENTS

| | | | | |
|---|---|---|---|---|
| 3,760,292 A | | 9/1973 | Kogelnik et al. | 331/94.5 |
| 4,740,987 A | | 4/1988 | McCall, Jr. et al. | 372/96 |
| 5,757,837 A | * | 5/1998 | Lim et al. | 372/50 |
| 5,973,336 A | * | 10/1999 | Hanke et al. | 257/94 |
| 5,976,905 A | | 11/1999 | Cockerill et al. | 438/36 |
| 6,001,664 A | | 12/1999 | Swirhun et al. | 438/31 |

(Continued)

FOREIGN PATENT DOCUMENTS

EP    0 342 953    11/1989

OTHER PUBLICATIONS

Ledentsov, Nikolai N., "Nanostructures How Nature Does It", Educational Centre at IOFFE Institute Invited Lecture. Oct. 13, 2000, Http://web.edu.ioffe.ru/lectures/index_en.html.

Deppe, D.G., 2000; Op toelectronic Properites of Semiconductors and Superlattices:, vol. 10, Vertical–Cavity Surface–Emitting Lasers: Technology and Applications; pp. 1–61.

Casey, Jr. H.C et al; 1978; "Hetero structure Lasers"; Part A. Academic Press, New York; 1978; pp. 34–57; pp. 71–79.

Meade, R.D. et al; 1993;"Accu rate theoretical analysis of photonic band–gap materials"; Physical Review B 48:11, pp 8434–8437.

Born, M. et al; 1980; "Prin ciples of Optics"; $6^{th}$ edition, Pergamon Press, pp 1–70.

(Continued)

*Primary Examiner*—Minsun Oh Harvey
*Assistant Examiner*—Phillip Nguyen
(74) *Attorney, Agent, or Firm*—Brown & Michaels, PC

(57) ABSTRACT

A novel class of semiconductor lasers, or "tilted cavity lasers" includes at least one active element with an active region generating an optical gain by injection of a current and mirrors. The active element is placed into a cavity. The cavity is designed such that the optical path of the resonant optical mode is tilted with respect to both the vertical direction and the lateral plane. Thus, the feedback both in the vertical and in the lateral direction is provided for the resonant optical mode. Depending on the particular embodiment, the laser operates as both a surface emitting laser and an edge-emitting laser. Employing a tilted optical mode allows the use of substantially fewer layers in the bottom and the top interference reflectors than in conventional lasers. This preserves the necessary high reflection coefficients. Also, a wavelength-stabilized laser is realized for edge-emitters. The wavelength stabilization is due to the difference in the dispersion laws for the tilted optical modes in layers having different refractive indices.

81 Claims, 32 Drawing Sheets

U.S. PATENT DOCUMENTS

| | | | |
|---|---|---|---|
| 6,154,480 A | 11/2000 | Magnusson et al. | 372/96 |
| 6,160,834 A | 12/2000 | Scott | 372/96 |
| 6,392,256 B1 | 5/2002 | Scott et al. | 257/184 |
| 6,611,539 B1 * | 8/2003 | Ledentsov et al. | 372/20 |
| 6,643,305 B1 * | 11/2003 | Bewley et al. | 372/45 |

OTHER PUBLICATIONS

N.N. Ledentsov and V.A. Shchukin. "Novel concepts for Injection Lasers" Opt. Eng. vol. 41, No. 12, 2002, p. 3193–3203.

"Materials and Devices For Optical and Wireless Communications (APOC02)—Conferences—APOC 2002" The International Society for Optical Engineering, Oct. 2002 http://spie.org/Conferences/Programs/02/apoc/conferences/index.cfm?fuseaction=4905.

N.N. Ledentsov and V.A. Shchukin. "Novel to Approaches to Semiconductor Lasers" Proceedings of SPIE, vol. 4905, 2002, p. 222–234.

IOP Select, Collected Articles from the Institute of Physics 2004 http://www.IOP.org/Select.

N N Ledentsov, et al. "Wavelength–stabilized tilted cavity quantum dot laser" Semicond. Sci. Technol. 19 No 10 (Oct. 2004) 1183–1188.

"ETOS 2004" Emerging Technologies in Optical Sciences: Shaping the future of Communications, Jul. 2004 http://www.physics.ucc.ie/ETOS/Speakers.html.

Ledentsov, Nikolai, "The Tilted Cavity Laser" Emerging Technologies in Optical Sciences: Shaping the future of Communications, ETOS 2004, Jul. 26–29, University College Cork.

"Nanomodeling—Conferences—SPIE Annual Meeting 2004–Programs–Conferences–SPIE web" The International Society for Optical Engineering http://spie.org/Conferences/Programs/04/am/conferences/index.cfm?fuseaction=5509.

V.A. Shchukin et al. "Tilted Cavity Laser" Nanomodeling, Proceedings of SPIE, vol. 5509, p. 61–71, 2004.

Physics and Simulation of Optoelectronic Devices XIII, Conference 5722, Proceedings of SPIE, vol. 5722, Jan. 2005.

N N Ledentsov, et al. "Edge and Surface Emitting tilted Cavity Lasers" to be presented at Jan. 2005 conference.

Compound Semiconductor Manufacture EXPO, Compound Semiconductor Week 2004, Oct. 2004.

N N Ledentsov, et al. "Tilted cavity lasers Based on Quantum Dots or Quantum Wells", Extended abstract of Compound Semiconductor conference, Oct. 2004.

Yariv, Ammon and Yeh, Pochi, "Optical Waves in Crystals" A Wiley–Interscience Publication; John Wiley & Sons, 1984, pp. 155–219.

Pezeshki B et al., "Multiple Wavelength Light Source using an Asymmetric Waveguide Coupler," Applied Physics Letters, American Institute of Physics. New York, US, vol. 65, No. 2, Jul. 11, 1994, pp. 138–140.

Pezeshki B. et al., "A Gratingless Wavelength Stabilized Semiconductor Laser," Applied Physics Letters, American Institute of Physics. New York, US, vol. 69, No. 19, Nov. 4, 1996, pp. 2807–2809.

Bardia Pezeshki et al., "Vertical Cavity Devices as Wavelength Selective Waveguides," Journal of Lightwave Technology, IEEE. New York, US, vol. 12, No. 10, Oct. 1, 1994, pp. 1791–1801.

* cited by examiner

TILTED CAVITY SEMICONDUCTOR LASER (TCSL) AND METHOD OF MAKING SAME

BACKGROUND OF THE INVENTION

1. Field of the Invention

The invention pertains to the field of semiconductor devices. More particularly, the invention pertains to surface emitting lasers and wavelength-stabilized edge-emitting lasers.

2. Description of Related Art

The semiconductor laser plays an important role in optical fiber transmission and signal amplification systems, wavelength division multiplexing transmission systems, wavelength division switching systems, and wavelength cross-connection systems, as well as in the field of optical measurements.

One of the major problems with semiconductor lasers is a variation of the energy band gap with temperature resulting in an undesirable temperature dependence of the wavelength of emitted light, particularly for high output power operation. One approach to wavelength stabilization includes using a distributed-feedback laser. Some examples of this approach include U.S. Pat. No. 3,760,292, entitled "INTEGRATED FEEDBACK LASER", issued Sep. 18, 1973, and U.S. Pat. No. 4,740,987, entitled "DISTRIBUTED-FEEDBACK LASER HAVING ENHANCED MODE SELECTIVITY", issued Apr. 26, 1988. For an edge-emitting semiconductor laser, distributed feedback is generally realized by a lateral modulation of the refractive index within the semiconductor or by shape modulation of the optical fiber. Distributed feedback enhances the selectivity of the optical modes of laser radiation. The wavelength of the emitted light is then fixed by the device design, and its temperature dependence is due to temperature variations of the refractive indices, which are significantly smaller than those of the energy band gap. However, this approach requires very complicated technological steps as compared to the epitaxial growth of a conventional laser.

Another approach includes using a vertical cavity surface emitting laser (VCSEL). This typically utilizes both n-type and p-type multilayer Bragg-stack mirrors formed by pairs of alternating high and low refractive index layers. High reflectivity of the mirrors leads to a sharp resonance, and the selected wavelength is determined by the cavity thickness. Temperature dependence of the wavelength is due to temperature variations of the refractive indices. A key point in the design of VCSELs is that layers having different refractive indices must be lattice-matched to the substrate. This requirement drastically reduces the number of possible materials to be used in Bragg mirrors. Typical Bragg mirrors include alternating layers of GaAlAs of differing compositions or alternating layers of GaAlAs and GaAs for GaAs-based lasers. In InP based lasers, alternating layers of GaInAs, AlInAs, GaAlInAs or GaInAsP of differing compositions are used. The layers are adjusted to provide λ/2 periodicity for the light wavelength in the crystal. Since the difference in refractive indices between the alternating layers is rather small, in order to achieve the high reflectivity required for laser operation, a typical mirror requires anywhere between 20 and 100 layers for different materials typically used for fabrication of Bragg reflectors. A major disadvantage of the conventional Bragg-stack mirror configuration is that between 40 to over 200 high quality layers may be required to fabricate a complete VCSEL.

Therefore, there is a need in the art to reduce the number of layers needed for fabricating mirrors. Prior art in this field includes a laser incorporating guided-mode resonance effects as disclosed in U.S. Pat. No. 6,154,480, entitled "VERTICAL-CAVITY LASER AND LASER ARRAY INCORPORATING GUIDED-MODE RESONANCE EFFECTS AND METHOD FOR MAKING THE SAME", issued Nov. 28, 2000. In this patent, one (or two) of the Bragg mirrors are replaced by a grating forming a waveguide for an optical mode in the lateral direction. Due to diffraction at the grating, the emitted light at a certain wavelength is coupled to a wave-guide mode, thus providing high reflection from the grating layer required for lasing. A serious disadvantage of this design is unavoidable lithographical steps in fabricating one or two gratings with a lateral periodicity, which do not allow fabricating a laser in a single epitaxial process. Moreover, in the practically more acceptable situation where only one top grating is used, the bottom Bragg reflector still has all of the limitations and disadvantages characteristic of a conventional VCSEL.

Therefore, there is a need in the art for a surface emitting laser which avoids multi-layered Bragg mirrors, and, more generally, a method for fabricating the complete structure of a wavelength-stabilized laser in a single epitaxial process.

SUMMARY OF THE INVENTION

A novel class of semiconductor lasers, or "tilted cavity lasers" includes at least one active element with an active region generating an optical gain by injection of a current and mirrors. The active element is placed into a cavity. The cavity is designed such that the optical path of the resonant optical mode is tilted with respect to both the vertical direction and the lateral plane. Thus, the feedback both in the vertical and in the lateral direction is provided for the resonant optical mode. Depending on the particular embodiment, the laser operates as both a surface emitting laser and an edge-emitting laser. Employing a tilted optical mode allows the use of substantially fewer layers in the bottom and the top interference reflectors than in conventional lasers. This preserves the necessary high reflection coefficients. Also, a wavelength-stabilized laser is realized for edge-emitters. The wavelength stabilization is due to the difference in the dispersion laws for the tilted optical modes in layers having different refractive indices.

DETAILED DESCRIPTION OF THE INVENTION

Figure 1:
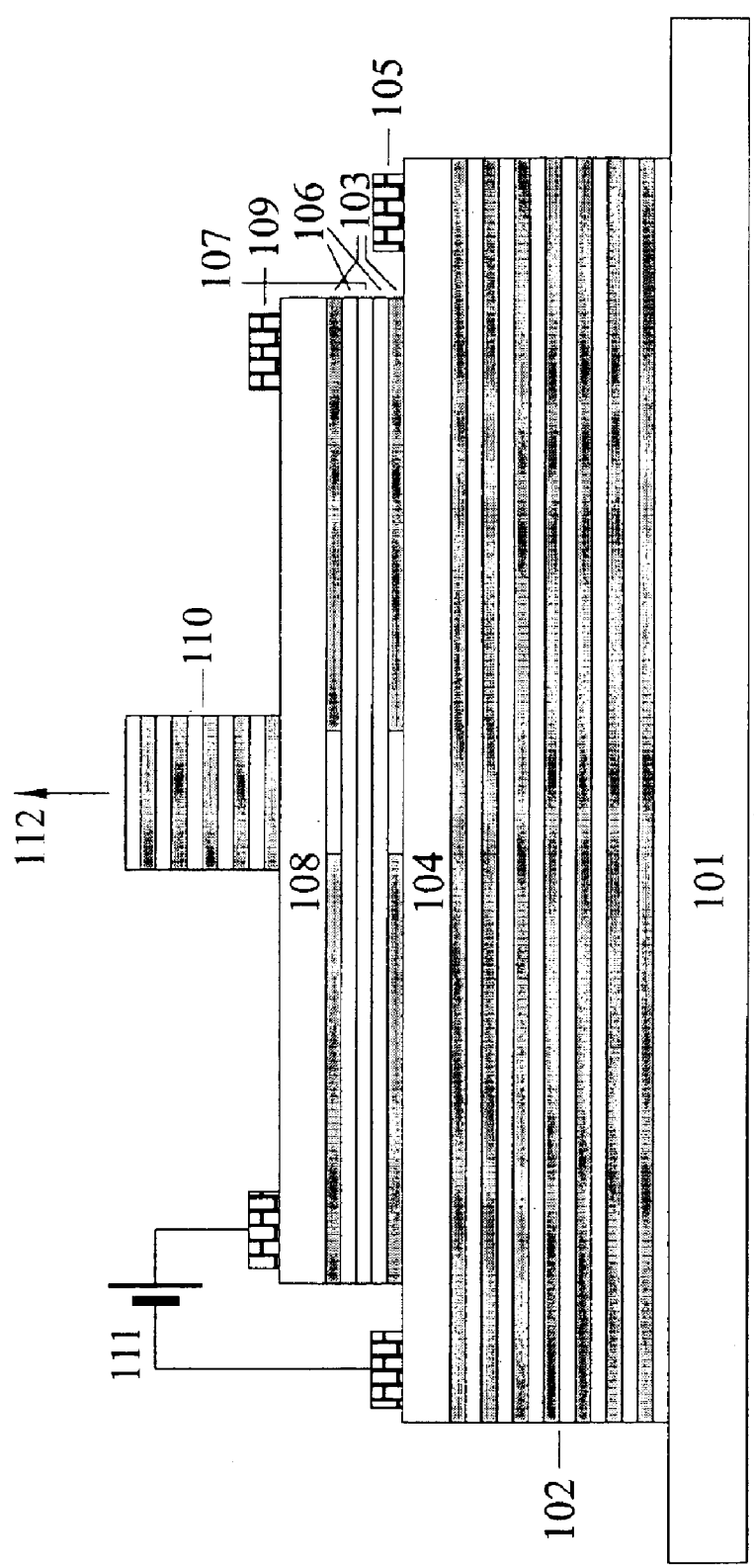
FIG. 1 shows a schematic diagram of the prior art of a vertical cavity surface emitting laser.

A prior art surface emitting laser, or more specifically, a vertical cavity surface emitting laser (VCSEL), is shown in FIG. 1. In a surface emitting laser, an active region is generally put into a cavity. An undoped or weakly doped active region is surrounded by n- and p-contact layers, which are generally surrounded by mirrors. The structure is grown epitaxially on a substrate (10). Bragg reflectors are used for the bottom mirror (102). The rest of the VCSEL is an active element.

A current aperture (13) separates an n-doped current spreading layer (14) having a first metal contact (15), from the weakly doped confinement layers (16) surrounding the active region (17). A second current aperture (13) separates the weakly doped confinement layer (16) from a p-doped current spreading layer (18) having a second metal contact (19). The n-doped current spreading layer (14) sits directly on top of the bottom mirror (102). The active element operates under forward bias (11). The active region (17) generates light. Confinement layers (16) serve to provide electronic confinement for the carriers trapped in the active region. The light comes out (112) through the top mirror (110).

The substrate (10) can be formed from any III-V semiconductor material or III-V semiconductor alloy, e.g. GaAs, InP, GaSb. GaAs or InP are generally used depending on the desired emitted wavelength of laser radiation. The n-doped layer (14) must be formed from the material lattice-matched or nearly lattice-matched to the substrate (10), transparent to the generated light, and doped by donor impurities. The n-doped layer (14) is preferably the same material as that of the substrate (10), e.g. GaAs. Possible donor impurities include, but are not limited to, S, Se, Te, and amphoteric impurities like Si, Ge, Sn where the latter are introduced under such technological conditions that they are incorporated predominantly into the cation sublattice and serve as donor impurities.

The p-doped layer (18) must be formed from a material, lattice-matched or nearly lattice-matched to the substrate (10), transparent to the generated light, and doped by an acceptor impurity. The p-doped layer (18) is preferably the same material as the substrate (10), e.g. GaAs. Possible acceptor impurities include, but are not limited to, Be, Mg, Zn, Cd, Pb, Mn and amphoteric impurities like Si, Ge, Sn where the latter are introduced under such technological conditions that they are incorporated predominantly into the anion sublattice and serve as acceptor impurities.

The metal contacts (15) and (19) are preferably formed from the multi-layered metal structures. Metal contacts (15) are preferably formed from structures including, but not limited to, the structure Ni—Au—Ge. Metal contacts (19) are preferably formed from structures including, but not limited to, the structure Ti—Pt—Au.

The confinement layers (16) must be formed from a material lattice-matched or nearly lattice-matched to the substrate (10), transparent to the emitted light, and undoped or weakly doped. The confinement layers are preferably formed from the same material as the substrate (10).

The active region (17) placed within the confinement layer (16) is preferably formed by any insertion, the energy band gap of which is narrower than that of the substrate (10). Possible active regions (17) include, but are not limited to, a single-layer or a multi-layer system of quantum wells, quantum wires, quantum dots, or any combination thereof. In a case of the device on a GaAs-substrate, examples of the active region (17) include, but are not limited to, a system of insertions of InAs, $In_{1-x}Ga_xAs$, $In_xGa_{1-x-y}Al_yAs$, $In_xGa_{1-x}As_{1-y}N_y$, or similar materials.

Each layer is separated from the neighboring layer by a current aperture (13) that works as a current blocking layer and can be formed from a material including, but not limited to, an Al(Ga)O layer or a proton bombardment layer.

Different designs for the bottom mirror (102) and for the top mirror (110) can be used, as described, e.g. in D. G. Deppe, *Optoelectronic Properties of Semiconductors and Superlattices* (Vol. 10, Vertical-Cavity Surface-Emitting Lasers: Technology and Applications, edited by J. Cheng and N. K. Dutta, Gordon and Breach Science Publishers, 2000, pp. 1–61). Typical designs include, but are not limited to, a multi-layered semiconductor mirror $GaAs/Ga_{1-x}Al_xAs$ for devices on GaAs substrate or a multilayered structure of a quaternary alloy $In_xGa_{1-x-y}Al_yAs$ with alternating composition for devices on an InP substrate.

A disadvantage of using this design is the need to fabricate Bragg mirrors with an extremely large number of layers because there is a very restricted choice of materials suitable to create Bragg mirror layers. All of the layers must be lattice-matched or nearly lattice matched to the substrate. For GaAs-based VCSELs, these layers are AlAs and $Ga_{1-x}Al_xAs$ alloys. For the emitted wavelength λ=0.98 μm, the difference in refractive indices between GaAs and AlAs is rather small (Δn=0.57), and about 30 periods (60 layers) are needed in a Bragg mirror to reach 99.5% reflectivity (see, e.g., U.S. Pat. No. 6,154,480). For InP-based VCSELs, a suitable lattice-matched material is the alloy $Ga_{0.47}In_{0.53}As$ and corresponding quaternary alloys $In_xGa_{1-x}As_{1-y}P_y$ with the composition (x, y) obeying the relation x=1−0.47(1−y) or quaternary alloys $In_xGa_{1-x-y}Al_yAs$ with the composition x=0.53 and arbitrary y. The difference in refractive indices between the layers is in this case even smaller (Δn=0.3), and about 100 periods (200 layers) are needed in the Bragg mirror.

The present invention solves the problem of the requirement for a large number of layers by using an active element designed such that the resonant optical mode is tilted to the mirrors. Since the reflection coefficient of the incident light increases with the tilt angle when light reflects from a single boundary between the two layers, a necessarily high reflection coefficient, for example 0.995, may be achieved from a resonant multilayered mirror having a significantly smaller number of layers than in conventional VCSELs. In particular, if the angle of incidence exceeds the angle of the total internal reflection at the boundary between the two layers, a reflector may comprise a single layer with a refractive index lower than that of the cavity. The laser of the present invention is called a "tilted cavity laser" herein. Specific examples of semiconductor devices using this design include photodetectors and amplifiers.

If the cavity comprises at least two layers having different refractive indices, the resonant conditions in both materials stabilize both the wavelength of emitted light and the tilt angle of the optical mode. Alternatively, wavelength stabilization is realized if the cavity is just a single layer surrounded by multilayered interference mirrors. Resonant conditions in both the cavity and the layer of the multilayered mirror having a different refractive index from that of the cavity stabilize both the wavelength of emitted light and the tilt angle of the optical mode. In another embodiment, the optical mode is used to exhibit the total internal reflection at the boundaries between the two semiconductor layers. The interplay between the radiative losses through the bottom and the top mirror, on the one hand, and through the side surface, on the other hand, stabilizes the wavelength of emitted light.

In one embodiment, a phase control element that contains a modulator exhibiting a strong narrow optical absorption peak on a short wavelength side from the wavelength of the laser generation is added to the laser. Wavelength control is realized by using an electro-optical effect. If a reverse bias is applied, the absorption maximum is shifted to longer wavelengths due to the Stark effect. If a forward bias is applied, a current is injected and results in the bleaching and reduction of the peak absorption. In both cases, a strong modulation of the refractive index occurs in the phase control element. The effect tunes the wavelength of the cavity mode.

In another embodiment, a power modulating element that contains an absorber exhibiting a moderate or weak optical absorption peak on a short wavelength side from the wavelength of the laser generation is added to the laser. Power modulation is realized by using an electro-optical effect. If a reverse bias is applied, the absorption maximum is shifted to longer wavelengths due to the Stark effect. This increases the internal losses of the optical mode and reduces the output power. If a forward bias is applied, a current is injected and results in the bleaching and reduction of the peak absorption, thus reducing internal losses of the optical mode and increasing the output power.

Figure 2:
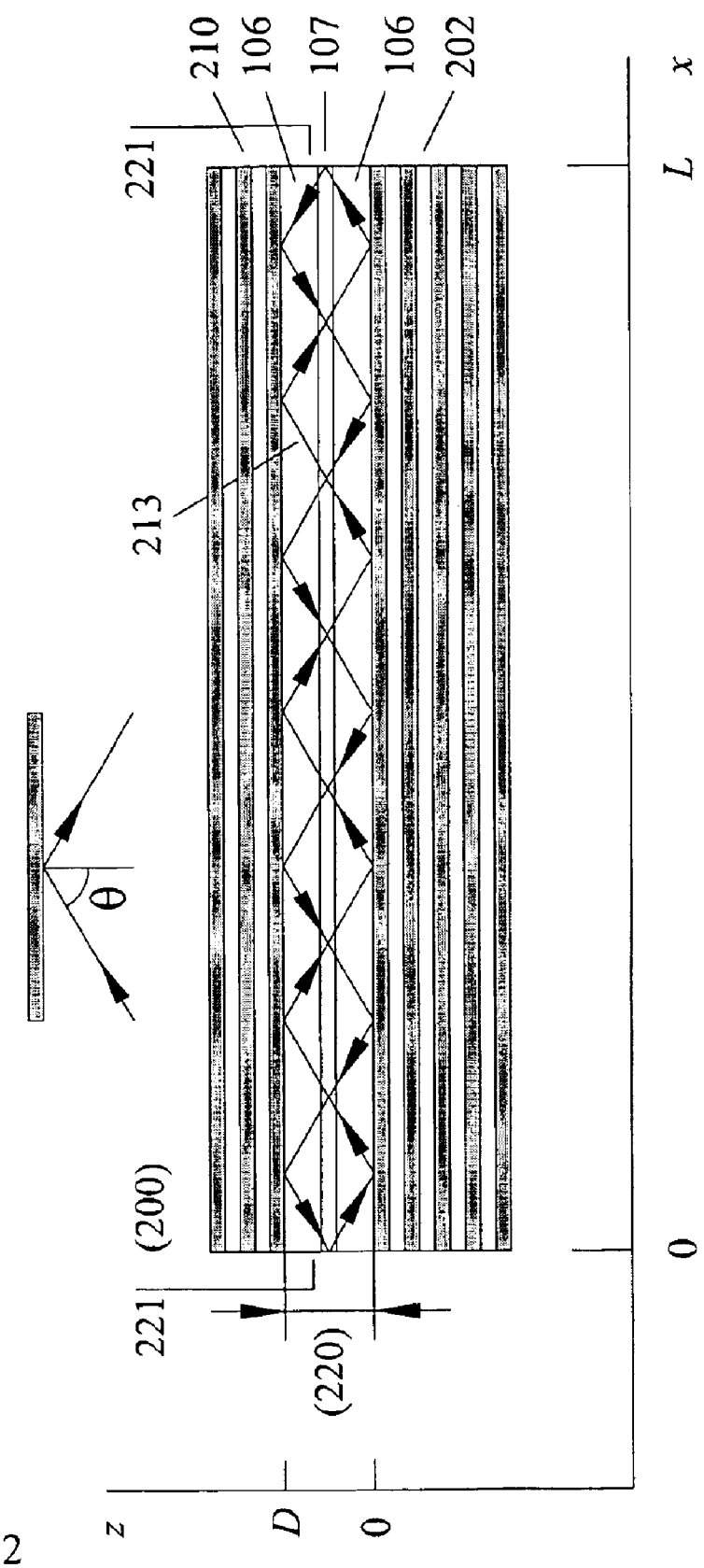
FIG. 2 shows a schematic diagram of a tilted mode of the cavity surrounded by two multilayered interference reflectors.

FIG. 2 illustrates schematically the principle of a laser using a tilted optical mode. The device (200) comprises the cavity (220) surrounded by the bottom reflector (202) and the top reflector (210). The cavity (220) includes an active region (107) surrounded by weakly doped or undoped confinement layers (106). The substrate, current spreading layers, metal contacts, and the bias are not shown in this figure for simplicity. Both the bottom reflector (202) and the top reflector (210) are resonant multi-layered structures exhibiting a high reflectivity in a certain range of angles and wavelengths. The number of layers within each reflector (202) and (210) is variable. Although each reflector (202) and (210) is multilayered in this figure, either or both of the reflectors could also comprise only a single layer (see FIG. 3). The inset defines the tilt angle θ of the incidence of light on the boundary between the layers.

The reflectors (202) and (210) comprise layered structures of the same materials as conventional mirrors (102) and (110), but contain fewer layers. Also, layers having a high refractive index, on the one hand, and layers having a low refractive index, on the other hand, may differ significantly in thickness. The optical path of a tilted mode (213) is shown as a closed line. The feedback in the vertical direction is provided by the bottom (202) and top (210) reflectors. For this particular embodiment, the feedback in the lateral direction is provided by the side mirrors (221) of the cavity (220).

Figure 3:
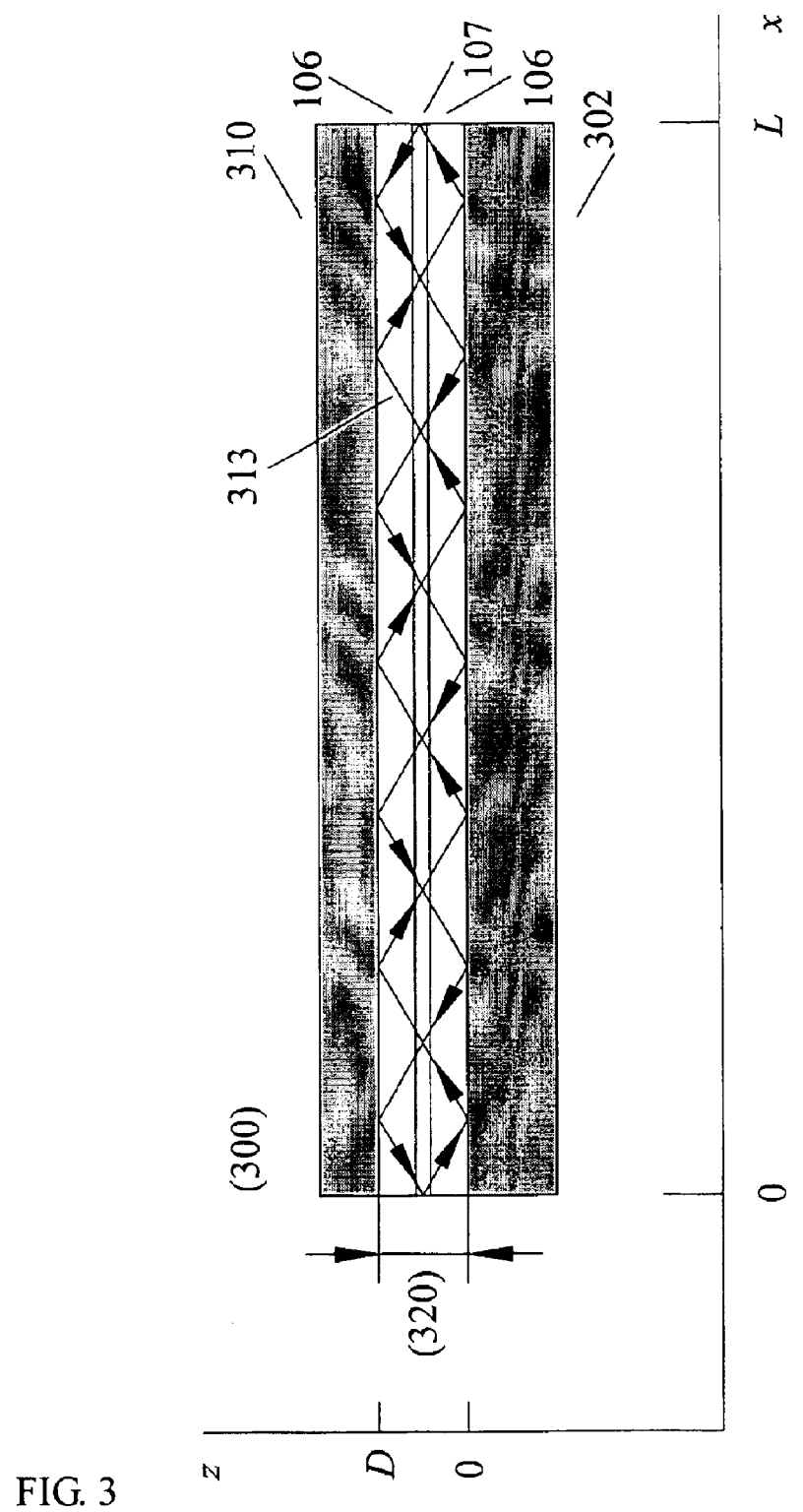
FIG. 3 shows a schematic diagram of a tilted mode of the cavity where light exhibits the total internal reflection from the reflectors, and reflectors with a single layer each are used.

FIG. 3 illustrates schematically the principle of a laser using a tilted optical mode and operating under conditions of total internal reflection from the bottom and the top reflectors. The device (300) comprises the cavity (320) surrounded by reflectors (302) and (310). The cavity (320) includes an active region (107) surrounded by undoped or weakly doped confinement layers (106). The substrate, current spreading layers, metal contacts, and the bias are not shown in this figure for simplicity. The optical path of a tilted mode (313) is shown as a closed line. Both the bottom reflector (302) and the top reflector (310) are single layers providing significant attenuation of the optical mode.

Each of the layers (302) and (310) are preferably lattice-matched or nearly lattice-matched to the substrate, transparent to the emitted light, and have refractive index $n_2$ lower than the refractive index $n_1$ of the cavity (320). A laser generating a tilted optical mode can emit light both in the vertical direction to operate as a surface emitting laser and in the lateral direction to operate as an edge-emitting laser.

A more detailed consideration is possible in a practical case where the lateral dimension (L) of the active region is larger than its vertical thickness (D), i.e.

$$L \gg D, \quad (1)$$

as shown both in FIG. 2 and in FIG. 3.

In a simpler case of FIG. 3 the structure may be treated as a three-layer slab wave-guide. Then, the electric field in a TE optical mode can be described as follows (H. C. Casey, Jr. and M. B. Panish, *Heterostructure Lasers, Part A*, Academic Press, New York, 1978, pp.34–57)

$$E_y = C_1 \cos(k_x x) \exp[-\kappa|z|], \text{ if } z<0; \quad (2a)$$

$$E_y = \cos(k_x x)[A \cos(k_z z) + B \sin(k_z z)], \text{ if } 0<z<D; \quad (2b)$$

$$E_y = C_2 \cos(k_x x) \exp[-\kappa(z-D)], \text{ if } z>D. \quad (2c)$$

The components of the wave vectors $k_x$ and $k_z$ are connected by the dispersion relation in the active region:

$$k_x^2 + k_z^2 = n_1^2 \left(\frac{2\pi}{\lambda}\right)^2, \quad (3)$$

and the attenuation coefficient κ is determined from the dispersion relation in the reflectors:

$$k_x^2 - \kappa^2 = n_2^2 \left(\frac{2\pi}{\lambda}\right)^2. \quad (4)$$

Here λ is the wavelength of the emitted light in the vacuum. Allowed wave vectors $k_x$ may be found by a standard procedure when boundary conditions at z=0 and z=D are imposed.

To analyze different types of optical modes in the cavity, it is convenient to characterize them by the wavelength λ and the angle θ as defined in FIG. 2. Then $$k_x = \frac{2\pi}{\lambda} n_1 \sin\theta.$$

Conditions of the total internal reflection at the boundary between the active region and the neighboring layers (302) and (310) are satisfied if $$\sin\theta > \frac{n_2}{n_1}. \quad (5)$$

For the wavelength λ=0.98 μm, we substitute the refractive index $n_1$=3.52 (as that of GaAs) and $n_2$=2.95 (as that of AlAs), and obtain θ>57°. If the optical mode satisfies Eq. (5), then the structure of FIG. 3 allows confinement of the optical mode in the cavity and high reflection coefficients from the reflectors.

For smaller tilt angles $$\sin\theta < \frac{n_2}{n_1}, \quad (6)$$

the light propagates in the layers with the refractive index $n_2$. Then the structure of FIG. 2 having multi-layered interference reflectors allows confinement of the optical mode. For a tilted optical mode, fewer layers in the reflectors are necessary as compared to the mode of normal incidence.

The resonant optical mode coming out through the reflectors still can not come out to the vacuum if the tilt angle θ exceeds the angle of total internal reflection at the boundary "semiconductor-vacuum", i.e.

$$\frac{1}{n_1} < \sin\theta. \quad (7)$$

For GaAs these are the angles θ>17°. For smaller angles of incidence, there is hardly any advantage with respect to conventional VCSELs. Thus, one needs a way to provide the output of light in the vertical direction for tilted optical modes.

Another embodiment of the present invention is possible, in which the cavity is surrounded by a multi-layered interference reflector, from the one side, and by a single-layered reflector, from the other side. The multi-layered interference reflector comprises a sequence of layers with alternating refractive indices $n_1$ and $n_2$, and the angle of incidence of the tilted optical mode θ is chosen such, that $$\sin\theta < \frac{n_2}{n_1},$$

thus the total internal reflectance does not occur at the boundary between the layers comprising the multi-layered reflector. The single-layered reflector is then a layer having a refractive index $n_3$ such that $$\sin \vartheta > \frac{n_3}{n_1},$$

and the total internal reflectance occurs at the boundaries between the cavity having the refractive index H and the reflector having the refractive index $n_3$. Possible embodiments include, but are not limited to a structure, in which the cavity is a layer of GaAs, the multi-layered reflector is a sequence of layers GaAs and $Ga_{1-x2}Al_{x2}As$, the single-layered reflectance is a layer of $Ga_{1-x3}Al_{x3}As$, and $x_3 > x_2$. In such a device, a bottom reflector can be a multi-layered interference reflector, and a top reflector can be a single-layered reflector. Alternatively, a bottom reflector can be a single-layered reflector, and a top reflector can be a multi-layered reflector.

Figure 4:
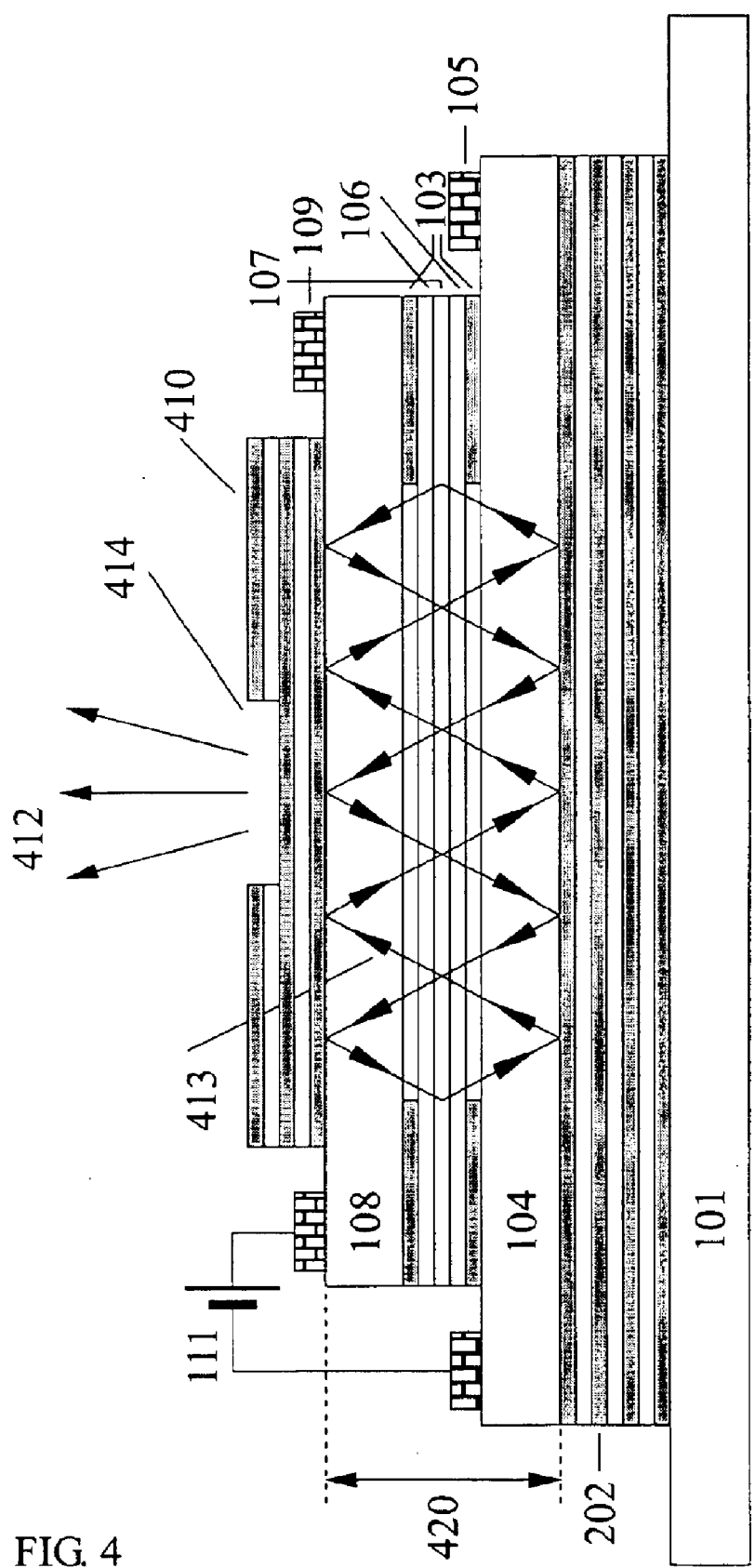
FIG. 4 shows a schematic diagram of one embodiment of the present invention, in which an optical aperture made by selective partial removal of multilayered reflector provides the light output in the vertical direction.

FIG. 4 shows an embodiment of the present invention where an optical aperture (414) is created by selective partial removal of several layers of the top reflector (410). To form the active region, a current aperture (103) separates an n-doped current spreading layer (104) having a first metal contact (105), from the weakly doped or undoped confinement layers (106) surrounding the active region (107). A second current aperture (103) separates the weakly doped or undoped confinement layer (106) from a p-doped current spreading layer (108) having a second metal contact (109). The active element operates under forward bias (111). The active region (107) generates light. Confinement layers (106) serve to provide electronic confinement for the carriers trapped in the active region (107).

The substrate (101) can be formed from any III-V semiconductor material or III-V semiconductor alloy, e.g. GaAs, InP, GaSb. GaAs or InP are generally used depending on the desired emitted wavelength of laser radiation. The n-doped layer (104) is preferably formed from the material lattice-matched or nearly lattice-matched to the substrate (101), transparent to the generated light, and doped by donor impurities. The n-doped layer (104) is preferably the same material as that of the substrate (101), e.g. GaAs. Possible donor impurities include, but are not limited to, S, Se, Te, and amphoteric impurities like Si, Ge, Sn where the latter are introduced under such technological conditions that they are incorporated predominantly into the cation sublattice and serve as donor impurities.

The p-doped layer (108) is preferably formed from a material, lattice-matched or nearly lattice-matched to the substrate (101), transparent to the generated light, and doped by an acceptor impurity. The p-doped layer (108) is preferably the same material as the substrate (101), e.g. GaAs. Possible acceptor impurities include, but are not limited to, Be, Mg, Zn, Cd, Pb, Mn and amphoteric impurities like Si, Ge, Sn where the latter are introduced under such technological conditions that they are incorporated predominantly into the anion sublattice and serve as acceptor impurities.

The metal contacts (105) and (109) are preferably formed from the multi-layered metal structures. Metal contacts (105) are preferably formed from structures including, but not limited to, the structure Ni—Au—Ge. Metal contacts (109) are preferably formed from structures including, but not limited to, the structure Ti—Pt—Au.

The confinement layer (106) is preferably formed from a material lattice-matched or nearly lattice-matched to the substrate (101), transparent to the emitted light, and undoped or weakly doped. The confinement layers (106) are preferably formed from the same material as the substrate (101).

The active region (107) placed within the confinement layer (106) is preferably formed by any insertion, the energy band gap of which is narrower than that of the substrate (101). Possible active regions (107) include, but are not limited to, a single-layer or a multi-layer system of quantum wells, quantum wires, quantum dots, or any combination thereof. In a case of the device on a GaAs-substrate, examples of the active region (107) include, but are not limited to, a system of insertions of InAs, $In_{1-x}Ga_xAs$, $In_xGa_{1-x-y}Al_yAs$, $In_xGa_{1-x}As_{1-y}N_y$, or similar materials.

Each layer is separated from the neighboring layer by a current aperture (103) that works as a current blocking layer and can be formed from a material including, but not limited to, an Al(Ga)O layer or a proton bombardment layer.

The tilted cavity (420) includes layers (103), (104), (105), (106), (107), and (108). The tilted cavity (420) is confined by the bottom reflector (202) and the top reflector (410) in the vertical direction. The tilted cavity (420) is confined by the current apertures (103) in the lateral plane. The resonant optical mode (413) light comes through the top reflector (410). Without an optical aperture (414), light does not come out of the structure, due to the total internal reflection from the boundary with the vacuum. The optical aperture (414) results in diffraction of light, and some diffracted components of light come out (412). The particular geometrical embodiment is calculated by solving a three-dimensional problem of the light propagation in an inhomogeneous medium by using, e.g., a method developed in R. D. Meade et al. *Accurate theoretical analysis of photonic band-gap materials* (Phys. Rev. B 48:11, 1993, pp. 8434–8437). In particular, typical embodiments include, but are not limited to, structures in which the active region (107) is placed at the maximum of the intensity of the tilted optical mode (413).

Figure 5:
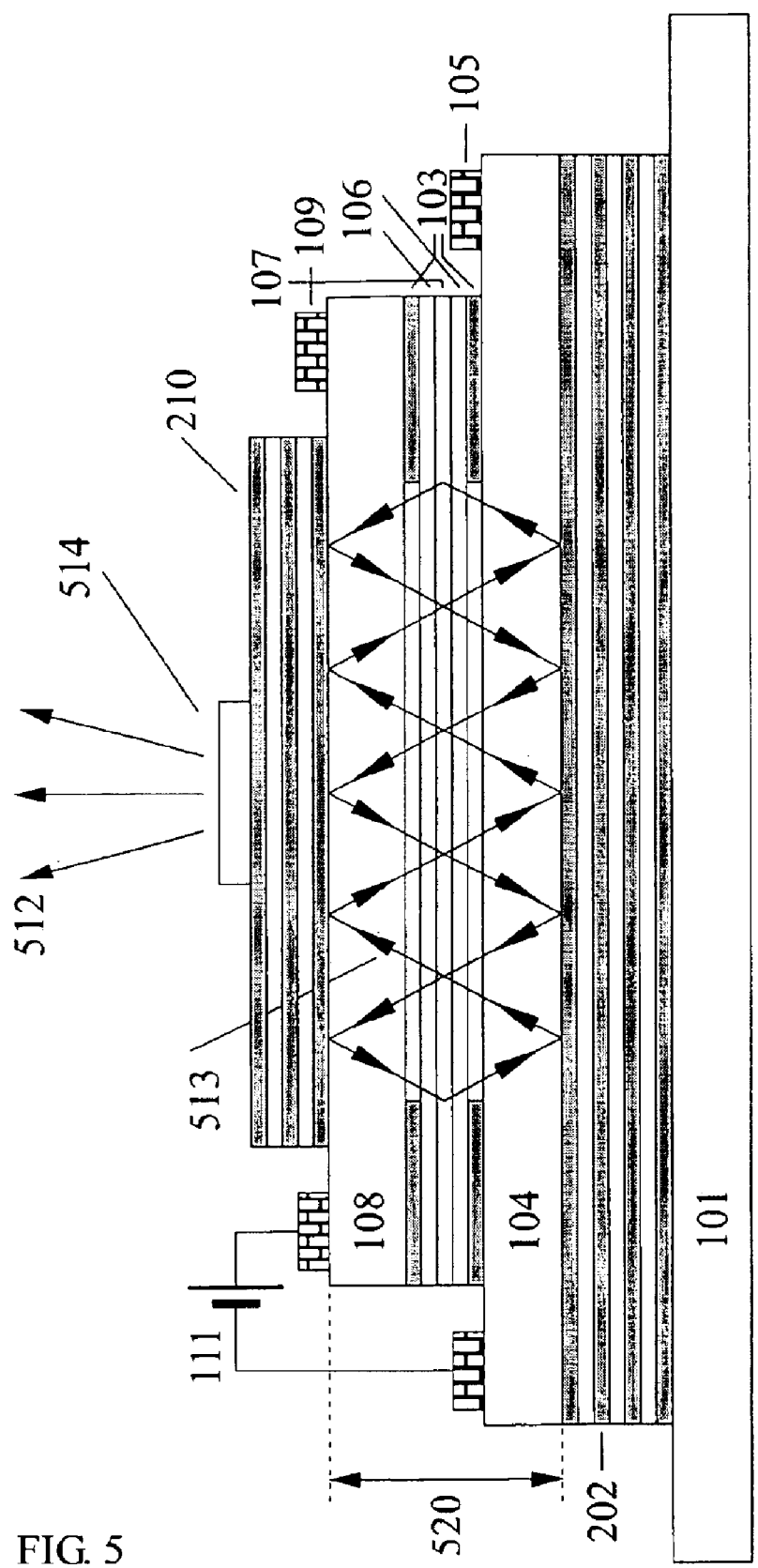
FIG. 5 shows a schematic diagram of one embodiment of the present invention, in which an optical aperture made by an additional deposited layer on top of the multilayered interference reflector provides the light output in the vertical direction.

FIG. 5 shows another embodiment of the present invention, in which an optical aperture (514) is introduced on top of the top multilayered reflector (210). The cavity (520) includes layers (103), (104), (105), (106), (107), and (108). The light of the resonant optical mode (513) comes through the top reflector (210). Some diffracted components of light provide the light output (512) in the vertical direction.

To calculate the resonant optical mode, which is selected by any given embodiment, one may consider the radiative losses of the tilted optical mode (213), $$\alpha_{rad} = \alpha_{bottom} + \alpha_{top} + \alpha_{side}, \tag{8}$$

where the losses via the bottom, top, and side surfaces of the structure of FIG. 2 equal:

$$\alpha_{bottom} = \frac{\cos\vartheta}{D} \ln\frac{1}{r_{bottom}}, \tag{9a}$$

$$\alpha_{top} = \frac{\cos\vartheta}{D} \ln\frac{1}{r_{top}}, \tag{9b}$$

$$\alpha_{side} = \frac{\sin\vartheta}{L} \ln\frac{1}{r_{side}}. \tag{9c}$$

Amplitude reflection coefficients from the bottom and top Bragg mirrors $r_{bottom}$ and $r_{top}$ may be calculated by using the method described in detail in M. Born and E. Wolf, *Principles of Optics* (6th edition, Pergamon Press, (1980) pp. 1–70).

Amplitude reflection coefficient from the side surface may be easily written in case of a thick cavity, where the optical mode may be approximated by a plane wave with the given $k_z$. Then $$r_{side} = \frac{k_x - \sqrt{k_0^2 - k_z^2}}{k_x + \sqrt{k_0^2 - k_z^2}}, \quad (10)$$

where $$k_0 = \frac{2\pi}{\lambda}$$

is the wave vector of light in the vacuum. Equation (10) can be extended to an actual profile of the optical mode in the z-direction by applying the method described in the book by H. C. Casey, Jr. and M. B. Panish, *Heterostructure Lasers, Part A* (Academic Press, New York, 1978, pp.71–79). The method is based on the approximation, that the difference in refractive index between semiconductor layers is smaller than that between semiconductor and vacuum, i.e.

$$|n_1 - n_2| \ll n_1 - 1. \quad (11)$$

Then Eq. (10) for the amplitude reflection coefficient can be generalized as $$r_{side} = \frac{k_x - \langle \tilde{k}_x \rangle}{k_x + \langle \tilde{k}_x \rangle}. \quad (12)$$

Here the quantity $\langle \tilde{k}_x \rangle$ is the average $$\langle \tilde{k}_x \rangle = \frac{\int \frac{dk_z}{2\pi} \sqrt{k_0^2 - k_z^2} |\tilde{E}_y(k_z)|^2}{\int \frac{dk_z}{2\pi} |\tilde{E}_y(k_z)|^2}, \quad (13)$$

and $\tilde{E}_y(k_z)$ is the Fourier transform of the electric field strength in the optical mode, $$\tilde{E}_y(k_z) = \int dz E_y(z) \exp(-ik_z z). \quad (14)$$

Figure 6:
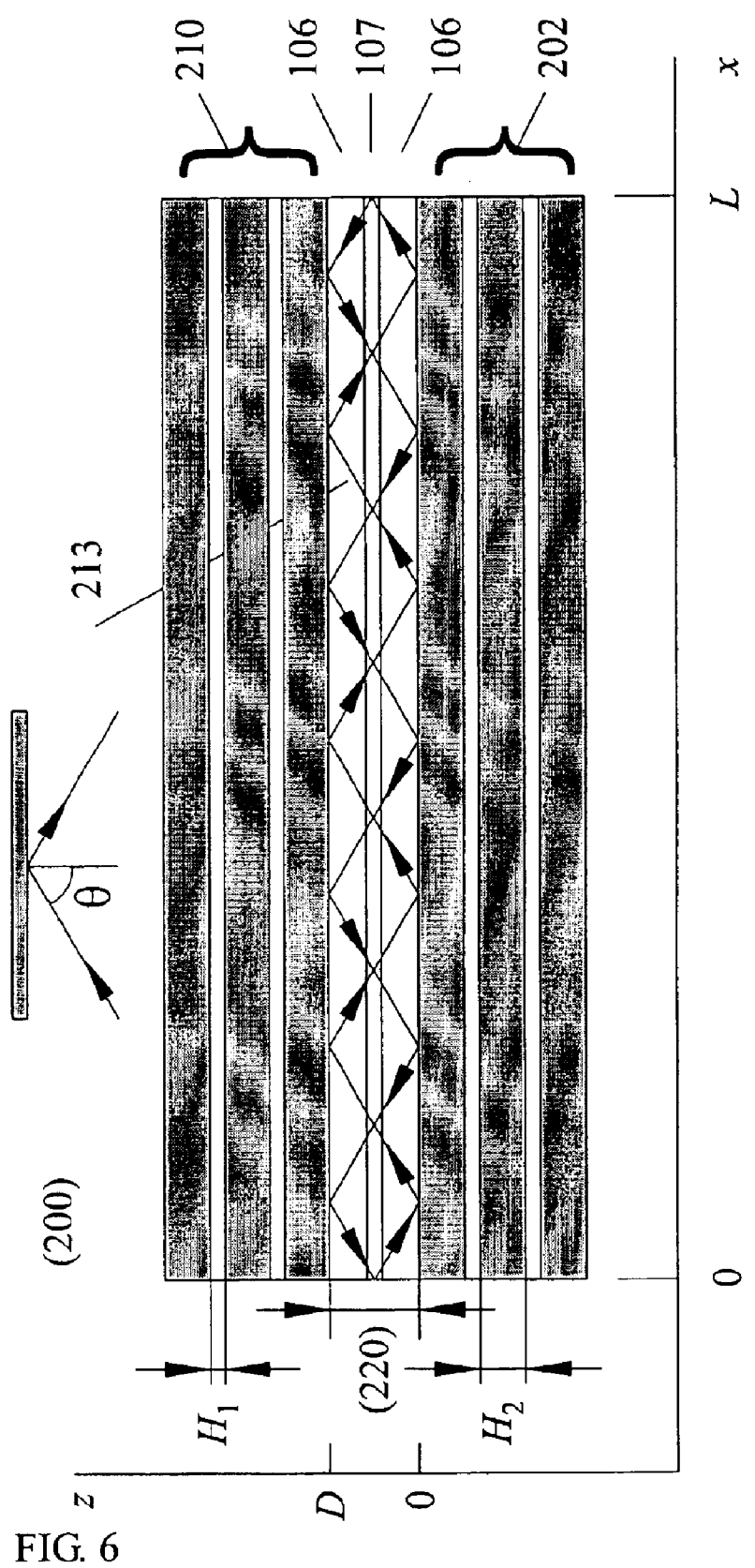
FIG. 6 shows a schematic diagram of a particular structure of the present invention comprising a cavity, a three-period bottom interference reflector, and a three-period top interference reflector.

FIG. 6 displays a particular example of the cavity, for which the radiative losses have been calculated. The bottom and the top Bragg reflectors (202) and (210) comprise alternating layers of GaAs (refractive index $n_1$=3.52) and $Ga_{0.75}Al_{0.25}As$ (refractive index $n_2$=3.38). The multilayered reflectors (202) and (210) are constructed as $0.25\lambda/1.75\lambda$3-layered structures. The thickness of the active region D=964 nm, the thickness of GaAs-layers in the reflectors equals $H_1$=241 nm, and the thickness of $Ga_{0.75}Al_{0.25}As$ layers is $H_2$=2691 nm. The lateral dimension of the cavity is L=50 μm.

Figure 7:
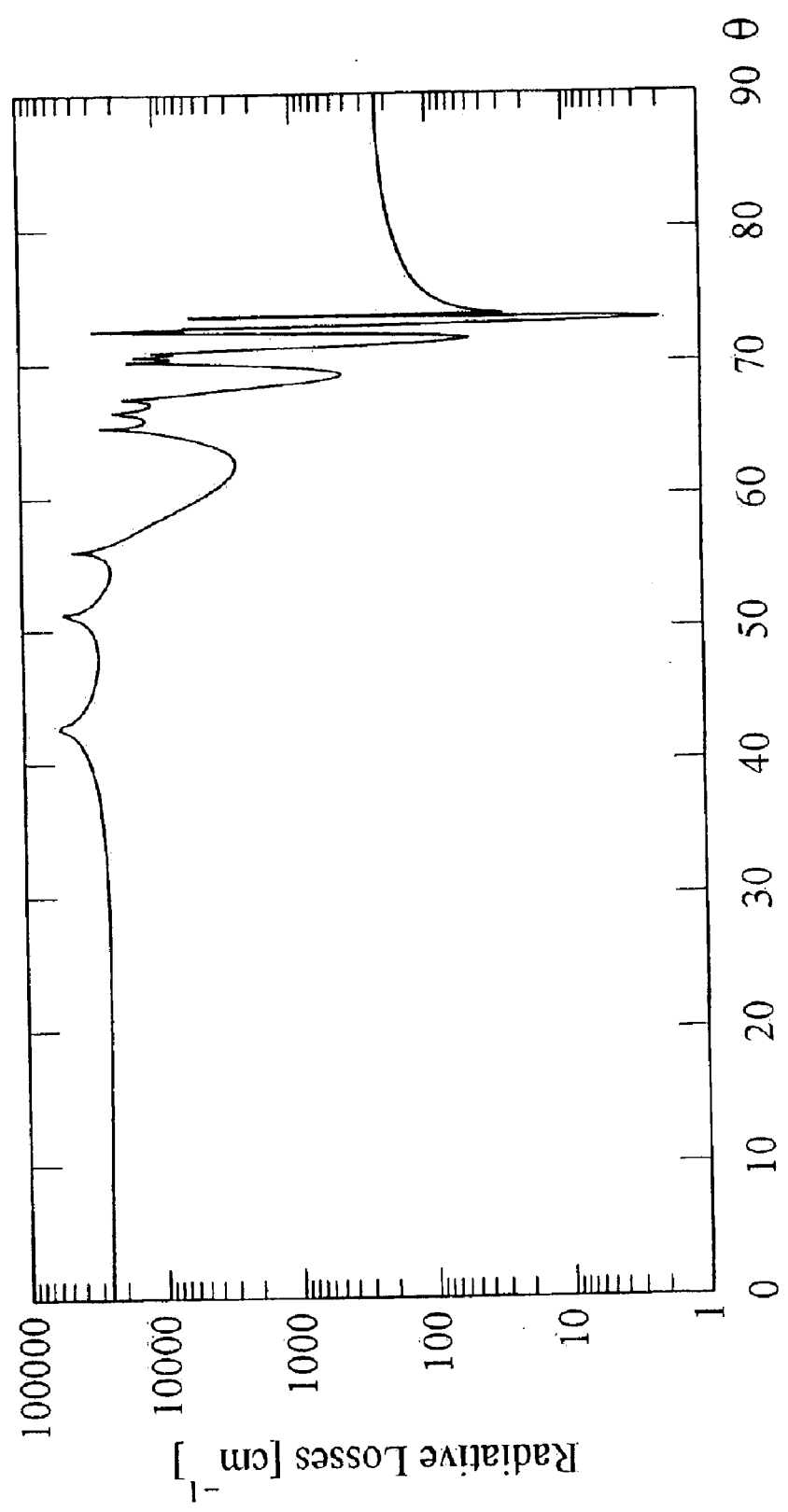
FIG. 7 shows the radiative losses for tilted optical modes calculated for the structure of FIG. 6 versus the tilt angle θ.

FIG. 7 displays the radiative losses of the tilted optical mode calculated by means of Eqs. (8), (9) and (12) for the given cavity as a function of the angle θ. At small and medium tilt angles, the losses are due mainly to the transmission of light through the bottom and the top multilayered reflectors. At large tilt angles, the losses are due mainly to the transmission of light through the side surface of the cavity. FIG. 7 displays a sharp minimum of the radiative losses at an angle ≈72°. This minimum provides efficient selection of optical modes, which are generated by the given laser structure.

Figure 8:
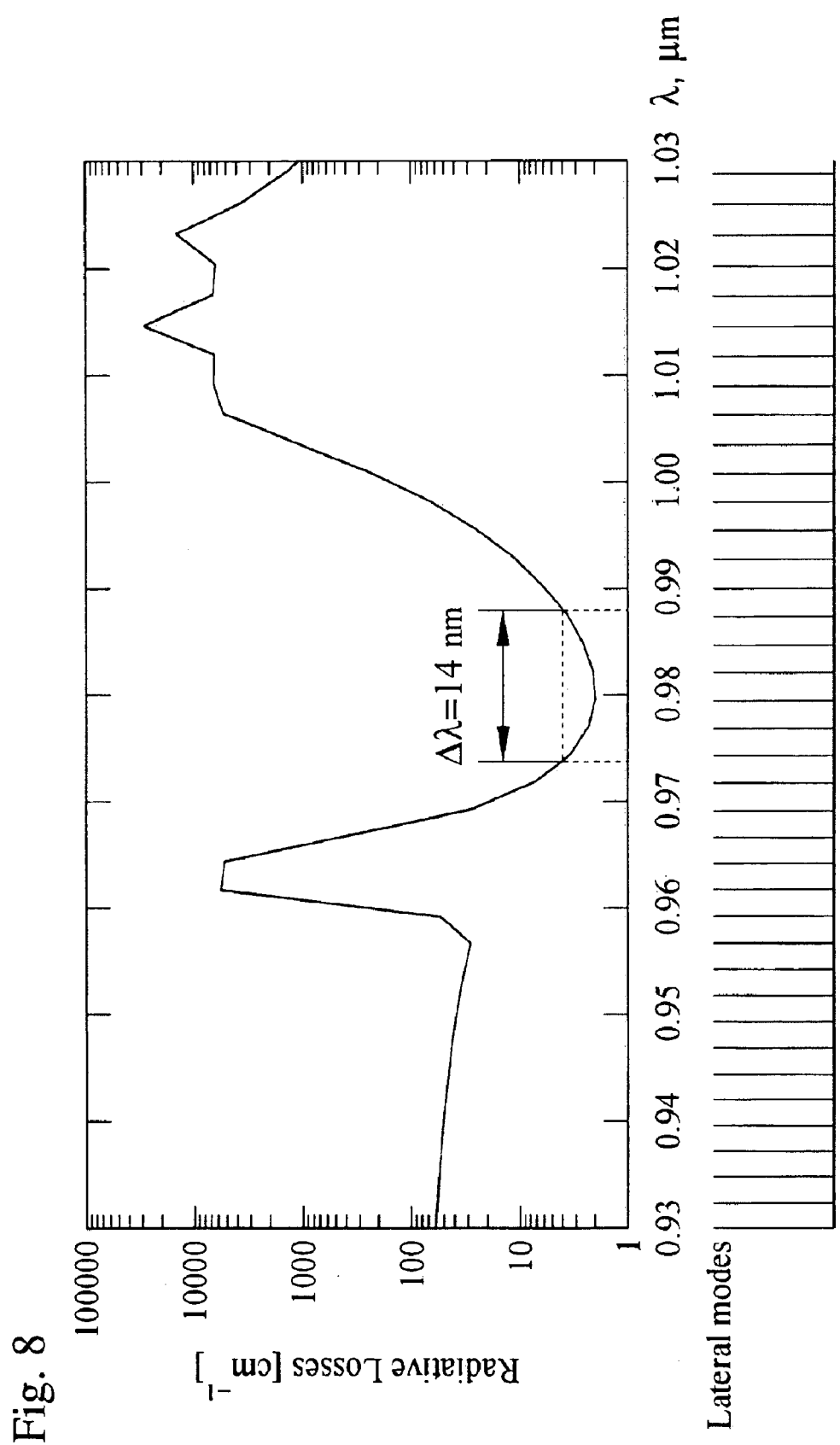
FIG. 8 shows the same schematic diagram of the radiative losses for tilted optical modes calculated for the structure of FIG. 6 presented as a function of the wavelength of emitted radiation.

FIG. 8 displays the radiative losses close to the minimum of $\alpha_{rad}$ as a function of the wavelength. Bars correspond to different lateral modes of the cavity. The figure displays the spectral range where $$\alpha_{rad}^{min} \leq \alpha \leq 2\alpha_{rad}^{min}. \quad (15)$$

A rather narrow spectral range of ≈14 nm demonstrates the possibility of efficient stabilization of the wavelength of the emitted light.

Figure 9:
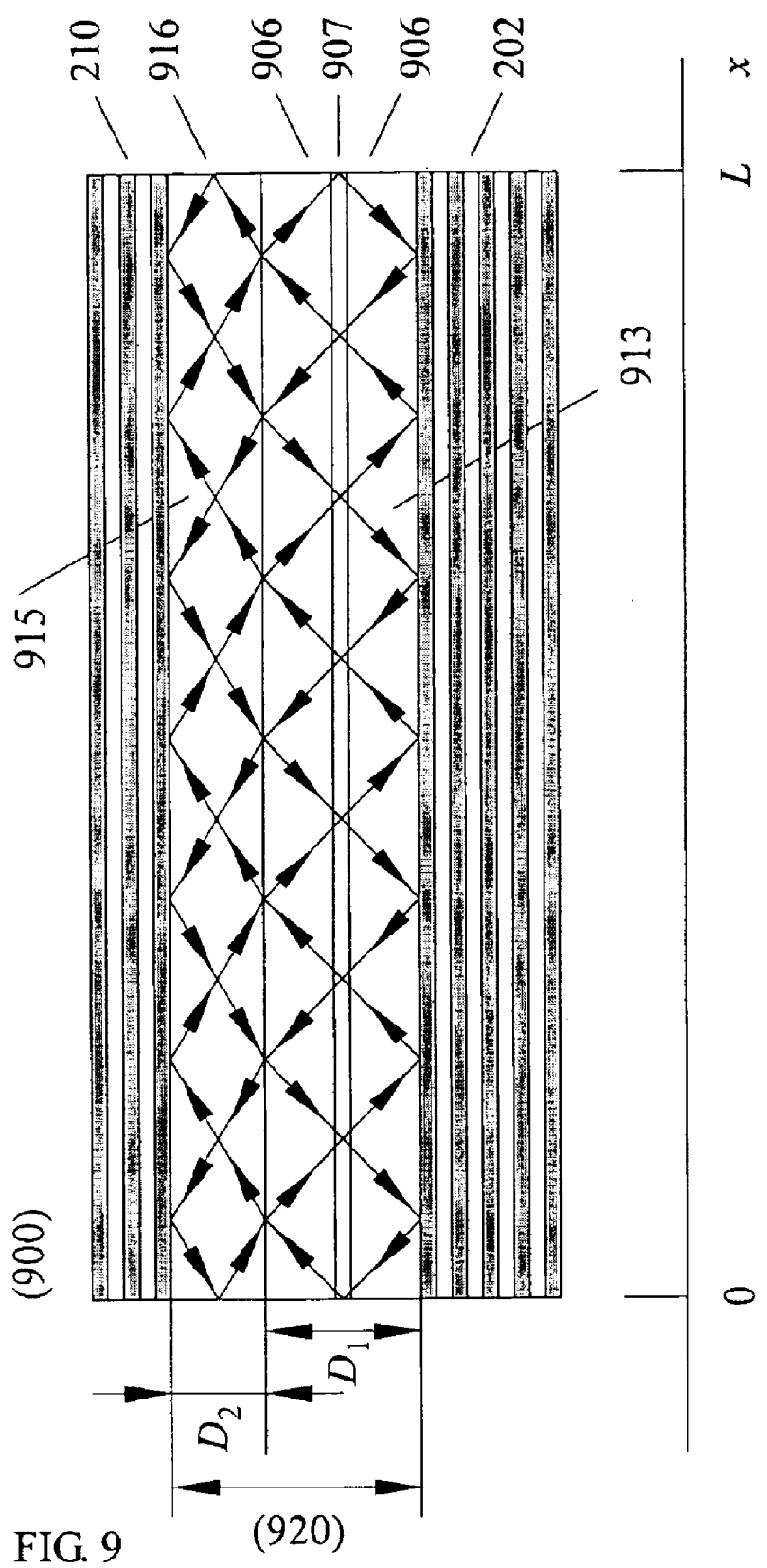
FIG. 9 shows a schematic diagram of a cavity including two layers having different refractive indices where the active layer is placed within one of the two layers of the cavity.

FIG. 9 shows a laser (900) where the cavity (920) includes two layers: layer (906) in which the active region (907) is placed, and layer (916). These layers have different refractive indices $n_1$ and $n_2$, respectively. For example, one layer (906) may have a high refractive index while layer (916) has an intermediate refractive index. Alternatively, one layer (906) has a low refractive index, while layer (916) has an intermediate refractive index. Although the active region (907) is in layer (906) in the figure, it may be located in either layer (906) or (916). In these examples, the topmost layer of the bottom reflector (202) and the bottommost layer of the top reflector (210) preferably have a high refractive index.

The path of a tilted optical mode comprises the path (913) within the layer (906), and the path (915) within the layer (916), where both reflection and transmission of light occurs at the boundary between the two layers. The tilted optical mode is in resonance with both layers (906) and (916). Each of the layers (906) and (916) is preferably formed from a material, lattice-matched or nearly lattice-matched to the substrate, transparent to the emitted light, and undoped or weakly doped.

Figure 10:
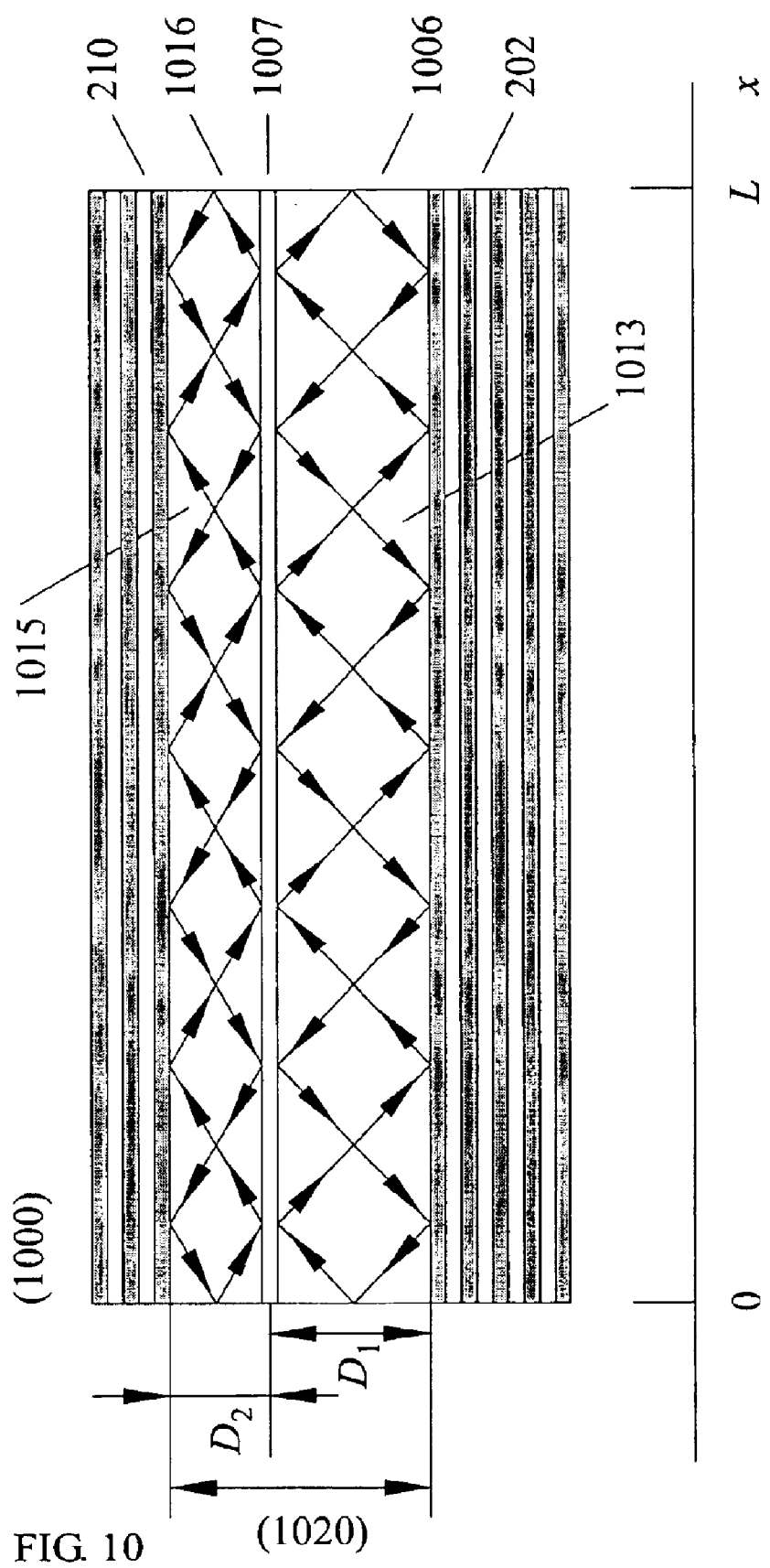
FIG. 10 shows a schematic diagram of a cavity including two layers having different refractive indices where the active layer is placed at the boundary between the two layers.

FIG. 10 shows a laser (1000) where the cavity (1020) comprises two layers: the layer (1006) and the layer (1016) having different refractive indices $n_1$ and $n_2$, respectively. The path of a titled optical mode includes a path (1013) within layer (1006) and a path (1015) within layer (1016). The active region (1007) is placed at the boundary between the layers (1006) and (1016). The tilted optical mode is in resonance with both layers (1006) and (1016).

To calculate radiative losses of the cavity of FIG. 10 we use the method described in detail in M. Born and E. Wolf, *Principles of Optics* (6th edition, Pergamon Press, (1980) pp. 1–70), and obtain $$\alpha_{rad} \propto \left| \left[1 - r_1 \exp(2ik_z^{(1)} D_1)\right]\left[1 + r_2 \exp(2ik_z^{(2)} D_2)\right] + \frac{k_z^{(2)}}{k_z^{(1)}}\left[1 + r_1 \exp(2ik_z^{(1)} D_1)\right]\left[1 - r_2 \exp(2ik_z^{(2)} D_2)\right] \right|^2 \quad (16)$$

where $r_1$ and $r_2$ are amplitude reflection coefficients from the top and the bottom mirror, respectively. Minimum of the losses (16) occurs if, $$r_1 > 0, r_2 > 0, (1 - r_1) \ll 1, (1 - r_2) \ll 1, \quad (17a)$$
$$2k_z^{(1)} D_1 = 2m_1 \pi, 2k_z^{(2)} D_2 = 2m_2 \pi,$$

or $$r_1 < 0, r_2 < 0, (1 + r_1) \ll 1, (1 + r_2) \ll 1, \quad (17b)$$
$$2k_z^{(1)} D_1 = (2m_1 + 1)\pi, 2k_z^{(2)} D_2 = (2m_2 + 1)\pi,$$

where $m_1$ and $m_2$ are integer numbers. Conditions of Eq. (17a) can be satisfied if the refractive index of the layer (1006) is higher than that of the topmost layer of the bottom multilayered reflector, and the refractive index of the layer (1016) is higher than that of the bottommost layer of the top multilayered reflector. Let the refractive index of the layer (1006) be $n_1$, the refractive index of the layer (1016) be $n_2$, and the multilayered reflectors comprise alternating sequences of the layers having refractive indices $n_1$ and $n_3$. Then Eq. (17a) can be satisfied if $n_1>n_3$ and $n_2>n_3$. Conditions of Eq. (17b) can be satisfied if the refractive index of the layer (1006) is lower than that of the topmost layer of the bottom multilayered reflector, and the refractive index of the layer (1016) is lower than that of the bottommost layer of the top multilayered reflector, i.e. $n_1<n_3$ and $n_2<n_3$. Each of these combinations of refractive indices may be realized by using semiconductor alloys of proper composition. E.g., for GaAs-based devices, a lattice-matched alloy $Ga_{1-x}Al_xAs$ at a wavelength $\lambda$=980 nm has a refractive index $n(x)\approx 3.52-0.57x$. Thus, by adjusting alloy composition x, a necessary profile of the refractive index can be achieved.

The z-components of the wave vectors in the two layers obey the following relations:

$$k_x^2 + (k_z^{(1)})^2 = n_1^2 \left(\frac{2\pi}{\lambda}\right)^2, \quad (18a)$$

$$k_x^2 + (k_z^{(2)})^2 = n_2^2 \left(\frac{2\pi}{\lambda}\right)^2. \quad (18b)$$

Here $k_x$ is the x-component of the wave vector, which, for a given optical mode, is the same in the two layers. This component is different for different lateral modes. Resonance conditions of Eqs. (17a) or (17b) yield two equations for unknown wavelength $\lambda$ and the wave vector component $k_x$. Thus, the optical mode is uniquely defined.

Other embodiments of the present invention include microcavities comprising three or more layers having different refractive indices, in which the active layer can be placed both within one of the layers or at the boundary between two of the different layers.

Figure 11:
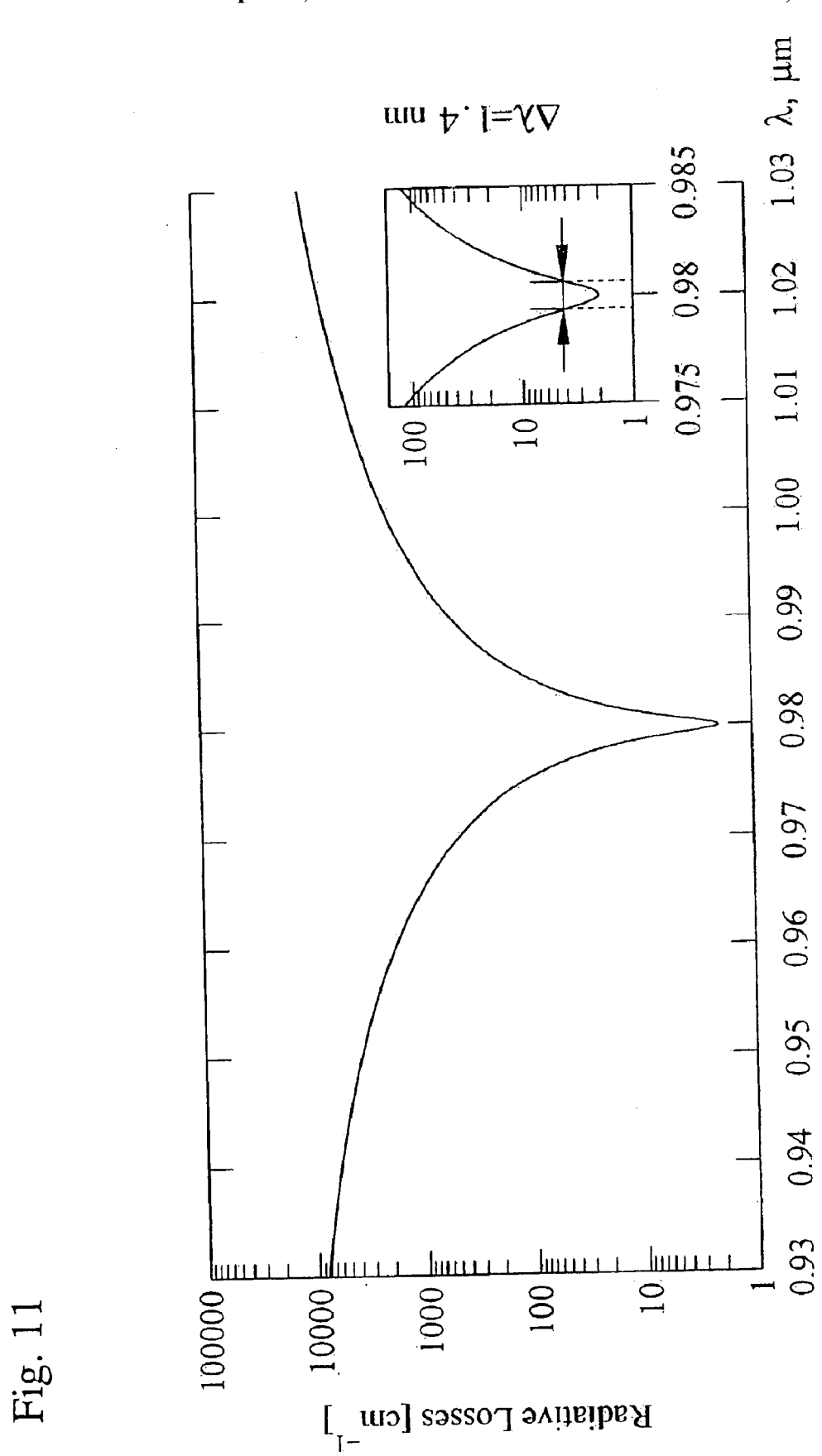
FIG. 11 shows the radiative losses calculated for the tilted optical mode in the cavity of FIG. 10 as a function of the wavelength.

FIG. 11 shows the results of the model calculations of the radiative losses through the bottom and the top multilayered reflectors for the tilted modes, according to Eq. (16). In this example, a 0.5$\lambda$–0.5$\lambda$ cavity includes a layer of GaAs having the refractive index $n_1$=3.52 and $Ga_{0.75}Al_{0.25}As$ having the refractive index $n_2$=3.38. The chosen tilted mode is the one with the tilt angle $\theta$=72°, which is close to the angle of the total internal reflection on the boundary of two semiconductors (the latter equals 73.7°). The thickness of the layers is $D_1$=451 nm, and $D_2$=1051 nm. The amplitude reflection coefficients of the both bottom and top multilayered reflectors are 0.995. This structure is resonant for the optical mode with the wavelength $\lambda$=0.98 $\mu$m. FIG. 11 demonstrates an extremely sharp resonance in the radiative losses with the width of $\Delta\lambda$=1.4 nm.

Figure 12:
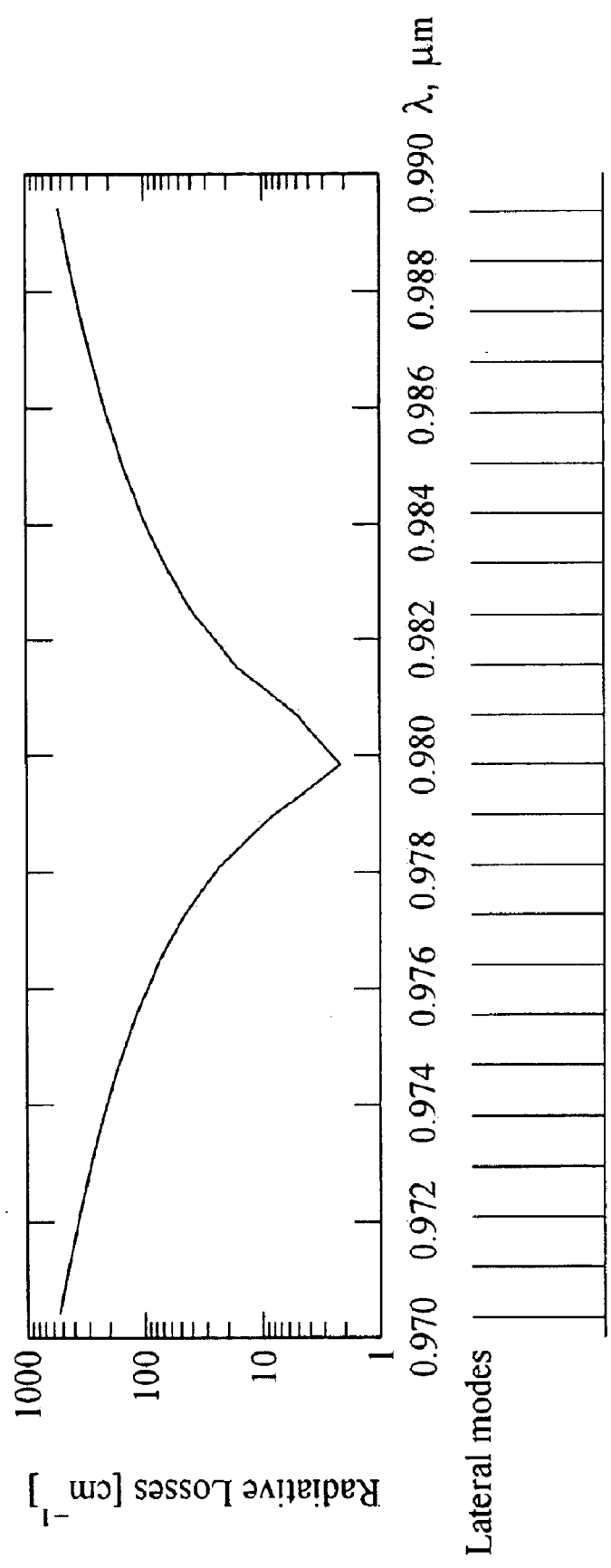
FIG. 12 shows the radiative losses calculated for different lateral optical modes for the cavity of FIG. 10.

FIG. 12 shows the radiative losses of the tilted optical modes of the cavity of FIG. 10 where the modes are in the exact resonance with the layer (1006), i.e.

$$k_z^{(1)} D_1 = \pi,$$

and different wavelengths correspond to different lateral modes of the cavity. The lateral dimension of the cavity was 300 $\mu$m. This cavity is typical for edge-emitting lasers. The result of FIG. 12 demonstrates a single lateral mode close to the minimum of the radiative losses. This shows that it is possible to construct lasers generating only a single lateral mode.

Figure 13:
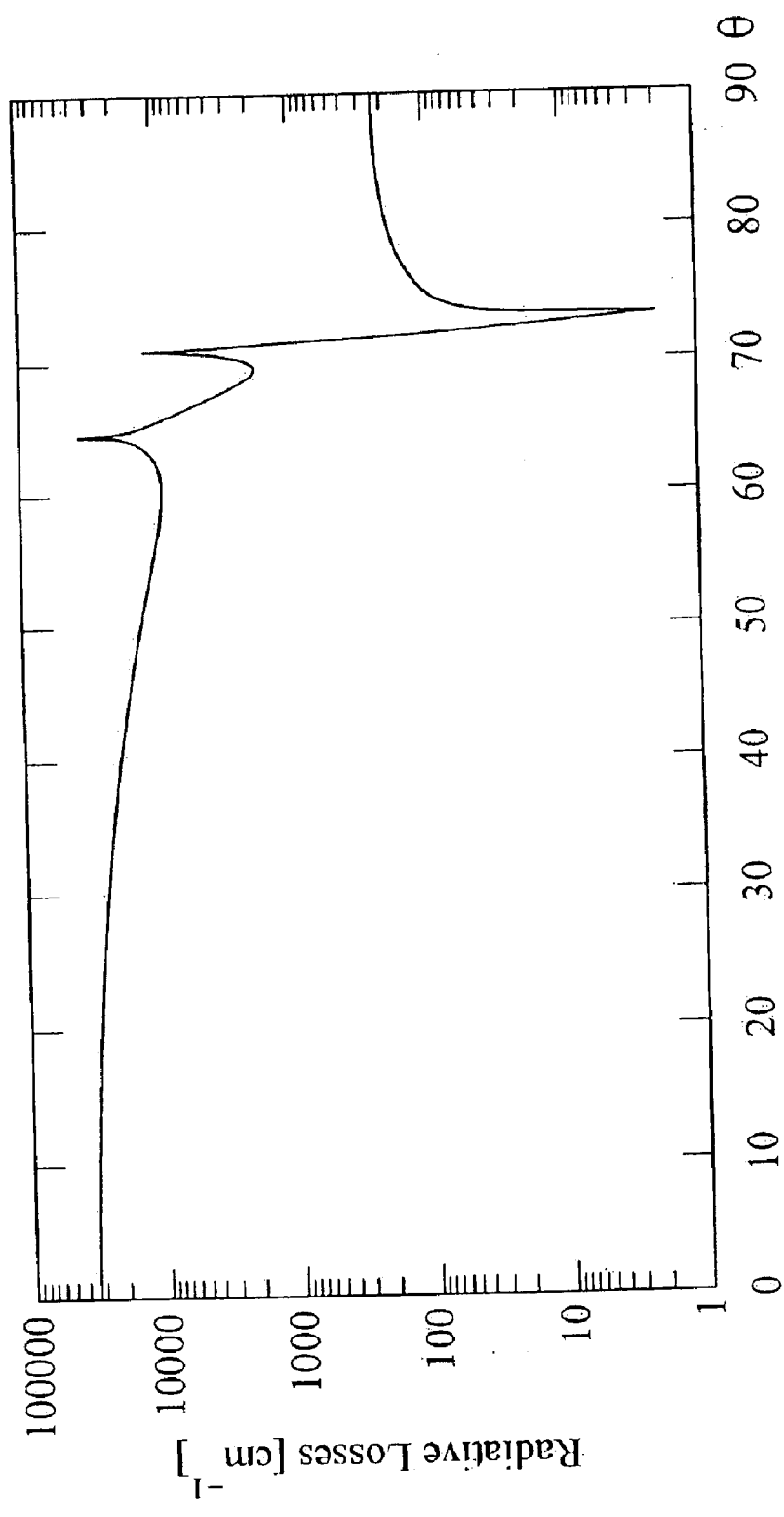
FIG. 13 shows the radiative losses for tilted optical modes calculated for the structure of FIG. 3 versus the tilt angle θ.

FIG. 13 displays the radiative losses of tilted optical mode for the cavity of FIG. 3 where the tilt angle of the optical mode exceeds the angle of the total internal reflectance at the boundary between the cavity (320) and the bottom reflector (302) as well as at the boundary between the cavity (320) and the top reflector (310). Calculations were carried out for a GaAs cavity (refractive index n=3.52) surrounded by cladding layers of $Ga_{0.7}Al_{0.3}As$ (refractive index n=3.35). In this example, the thickness of the cavity is 245 nm, the thickness of each cladding layer is 1400 nm, and the length of the cavity equals L=50 $\mu$m. At small and medium tilt angles, the losses are due mainly to the transmission of light through the bottom (302) and top reflectors (310). At large tilt angles, the losses are due mainly to the transmission of light through the side surface of the cavity. FIG. 13 displays a sharp minimum of the radiative losses at an angle $\approx$72°. This minimum provides efficient selection of optical modes, which are generated by the given laser structure.

Figure 14:
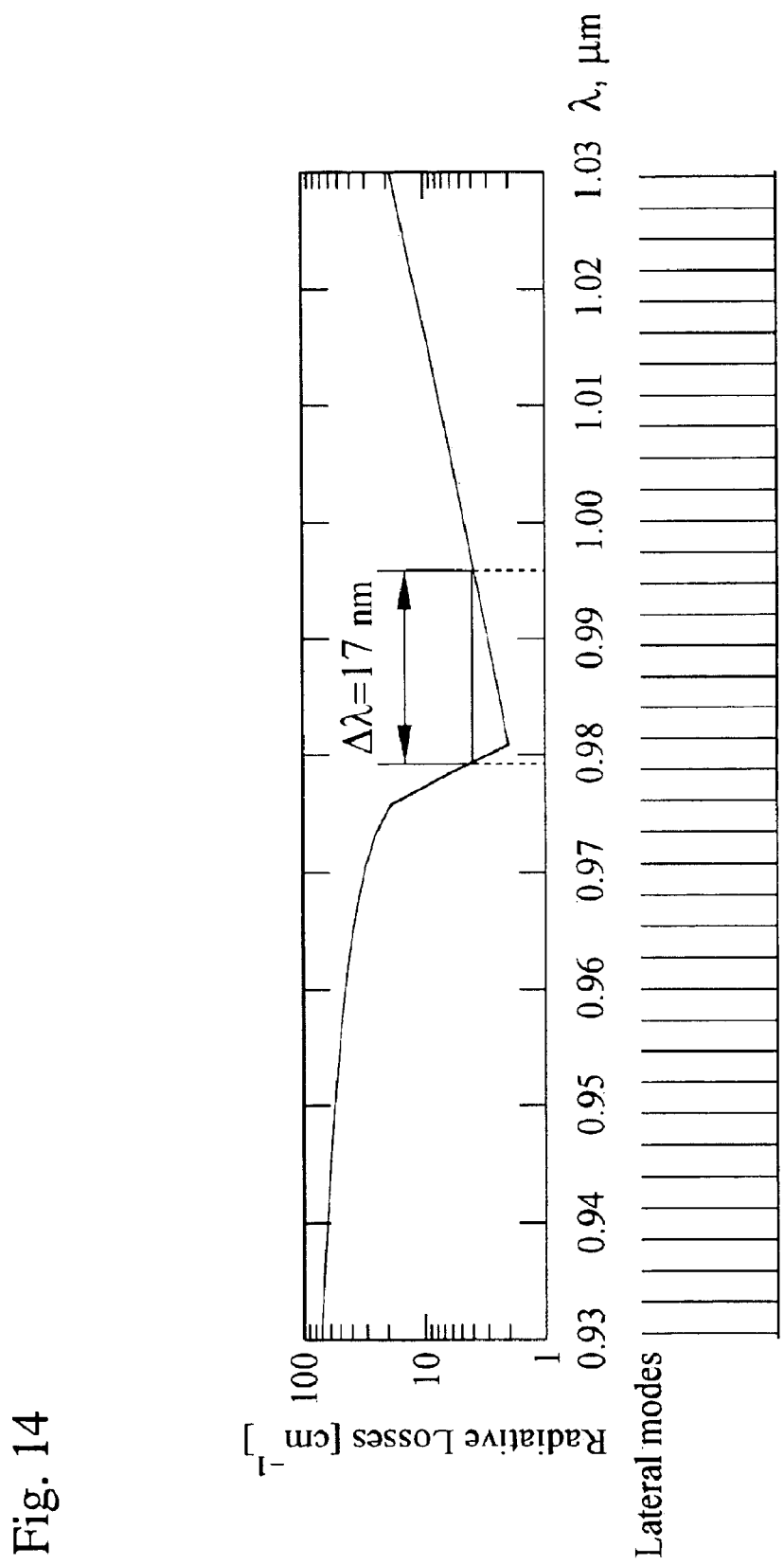
FIG. 14 shows the same schematic diagram of the radiative losses for tilted optical modes calculated for the structure of FIG. 3 presented as a function of the wavelength of emitted radiation.

FIG. 14 displays the radiative losses close to the minimum of $\alpha_{rad}$ as a function of the wavelength. Bars correspond to different lateral modes of the cavity. The spectral range of the width of $\approx$17 nm corresponds to the optical modes, the losses of which do not exceed twice the minimum losses. For all considered designs of the cavity, the light output from the tilted optical mode may be provided through both the top (and the bottom) reflector, as well as through the side surface.

Figure 15:
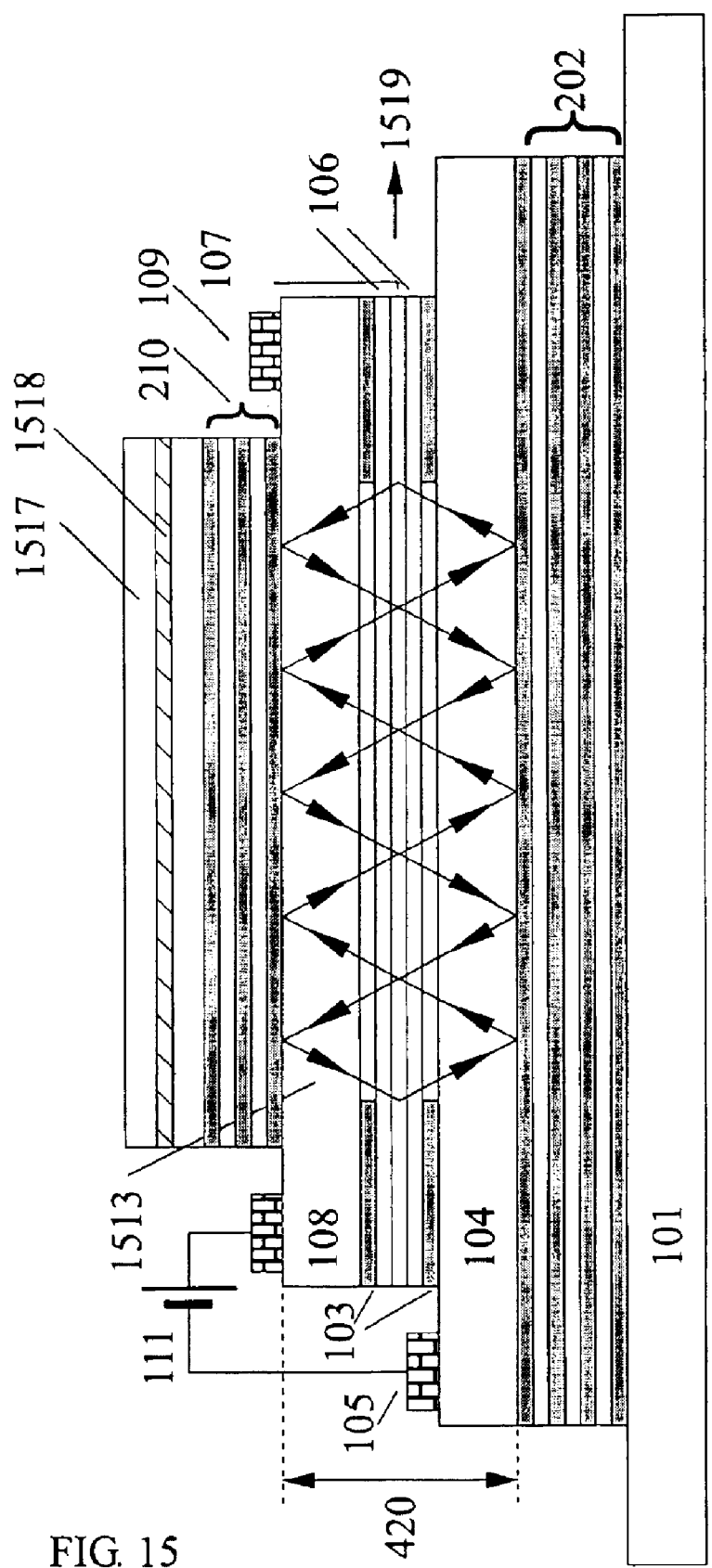
FIG. 15 shows a schematic diagram of another embodiment of the present invention, in which an absorbing element including an absorbing region is placed on top of the top reflector.

FIG. 15 shows another embodiment of the present invention, in which an absorbing element (1517) is placed on top of the top multilayered reflector (210), and an absorbing region (1518) is placed within the absorbing element (1517). Thus, the multilayered reflector (210) provides the selection of the wavelength, at which the losses are minimum. Light transmitted through the top reflector (210), is absorbed by the absorbing region (1518). The absorbing region (1518) absorbs light transmitted through the reflector (210) to provide light output in the lateral direction. The light (1519) comes out of the laser through the side surface of the cavity, the laser thus operating as a wavelength-stabilized edge-emitting laser.

In a variation of this embodiment, the absorbing element (1517) is sandwiched between the substrate (101) and the bottom reflector (202), and the absorbing layer (1518) absorbs light transmitted through the bottom reflector (202). In another variation, the light transmitted through the bottom (202) or the top reflector (210) is absorbed by contact layers.

The feedback in the lateral direction of the tilted optical mode (1513) can generally be provided by any step or steps in the refractive index. For example, this may be the surface of the cavity, the interface between the cavity and dielectric coating, an etched reflector, or a grating fabricated on top of the top reflector.

Figure 16:
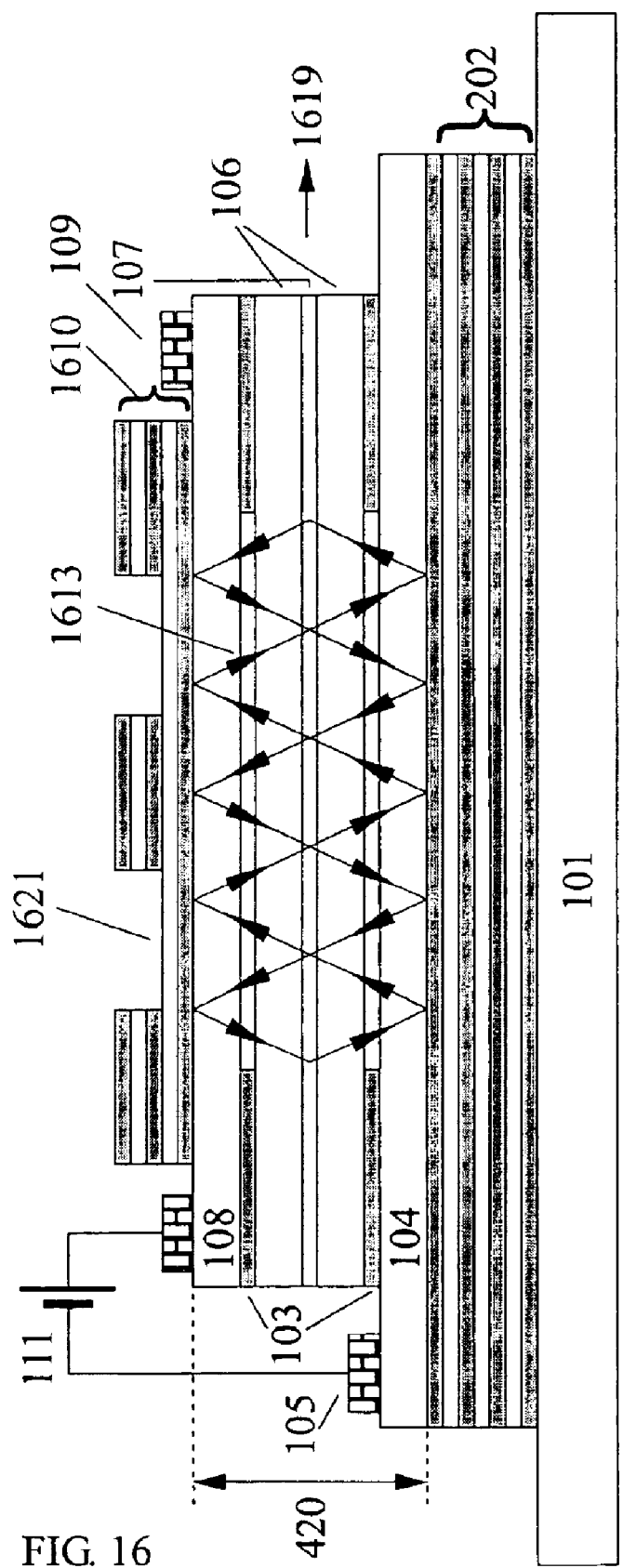
FIG. 16 shows a schematic diagram of another embodiment of the present invention, in which the top multilayered interference reflector is partially etched to provide feedback in the lateral direction for the tilted optical mode.

FIG. 16 shows another embodiment of the present invention, in which the top multilayered reflector (1610) is selectively etched (1621) thus promoting additional feedback in the lateral direction for the tilted optical mode (1613). The light (1619) comes out of the laser through the side surface of the cavity (420), thus operating as a wavelength-stabilized edge-emitting laser. This embodiment differs from the embodiment of FIG. 4 in the following ways. The selective etching (1621) may create a periodic modulation of the thickness of the top multilayered reflector (1610) thus promoting additional feedback in the lateral direction and enhancing the selectivity in the wavelength of the emitted light. On the contrary, the top aperture (414) of the embodiment of FIG. 4 is designed just to promote the output of light in the vertical direction. The output in the vertical direction can be realized by a single aperture, and a periodic etching of the top reflector is not necessary.

Figure 17:
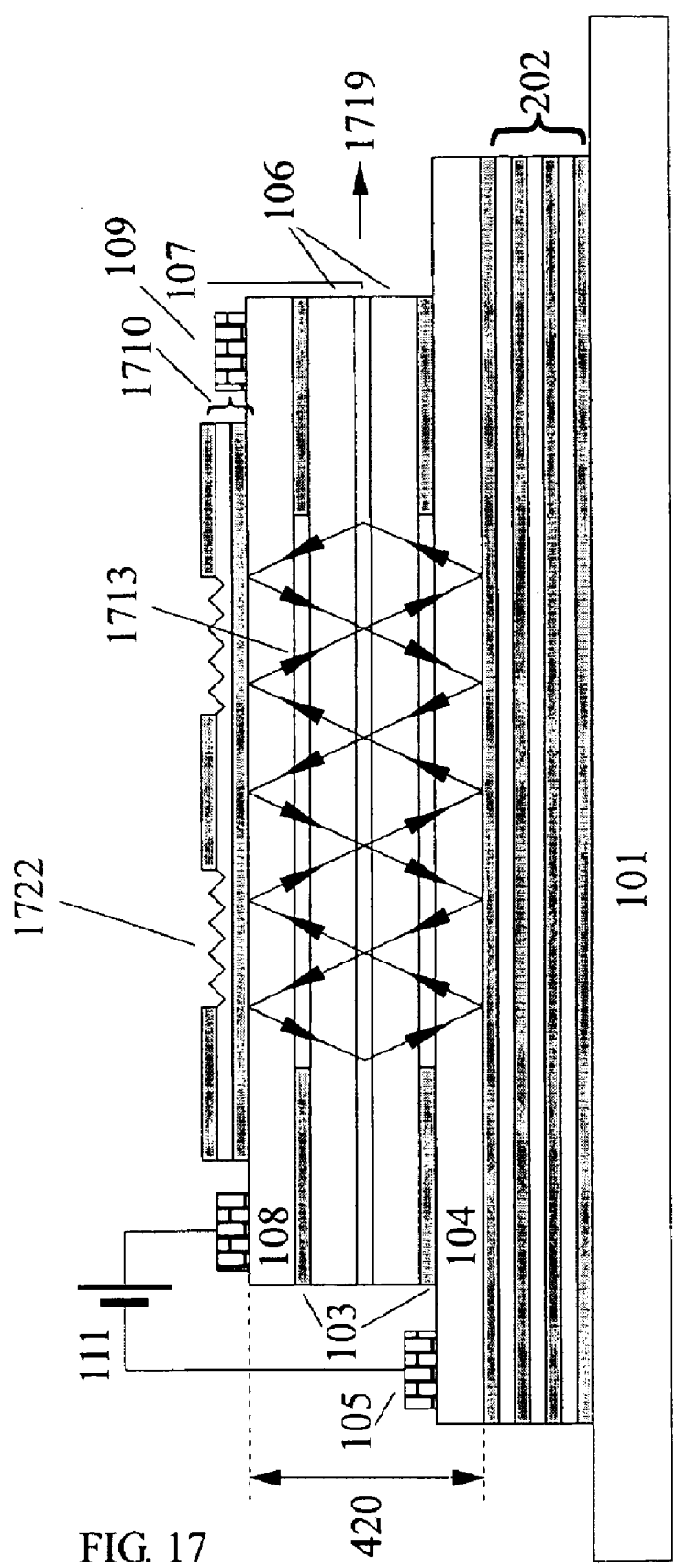
FIG. 17 shows a schematic diagram of another embodiment of the present invention, in which a grating is fabricated on top of the top multilayered interference reflector to provide feedback in the lateral direction for the tilted optical mode.

FIG. 17 shows another embodiment of the present invention, in which a grating (1722) is fabricated on top of the top multilayered reflector (1710). The grating (1722) promotes additional feedback in the lateral direction for the tilted optical mode (1713). The light (1719) comes out of the laser through the side surface of the cavity (420).

Figure 18:
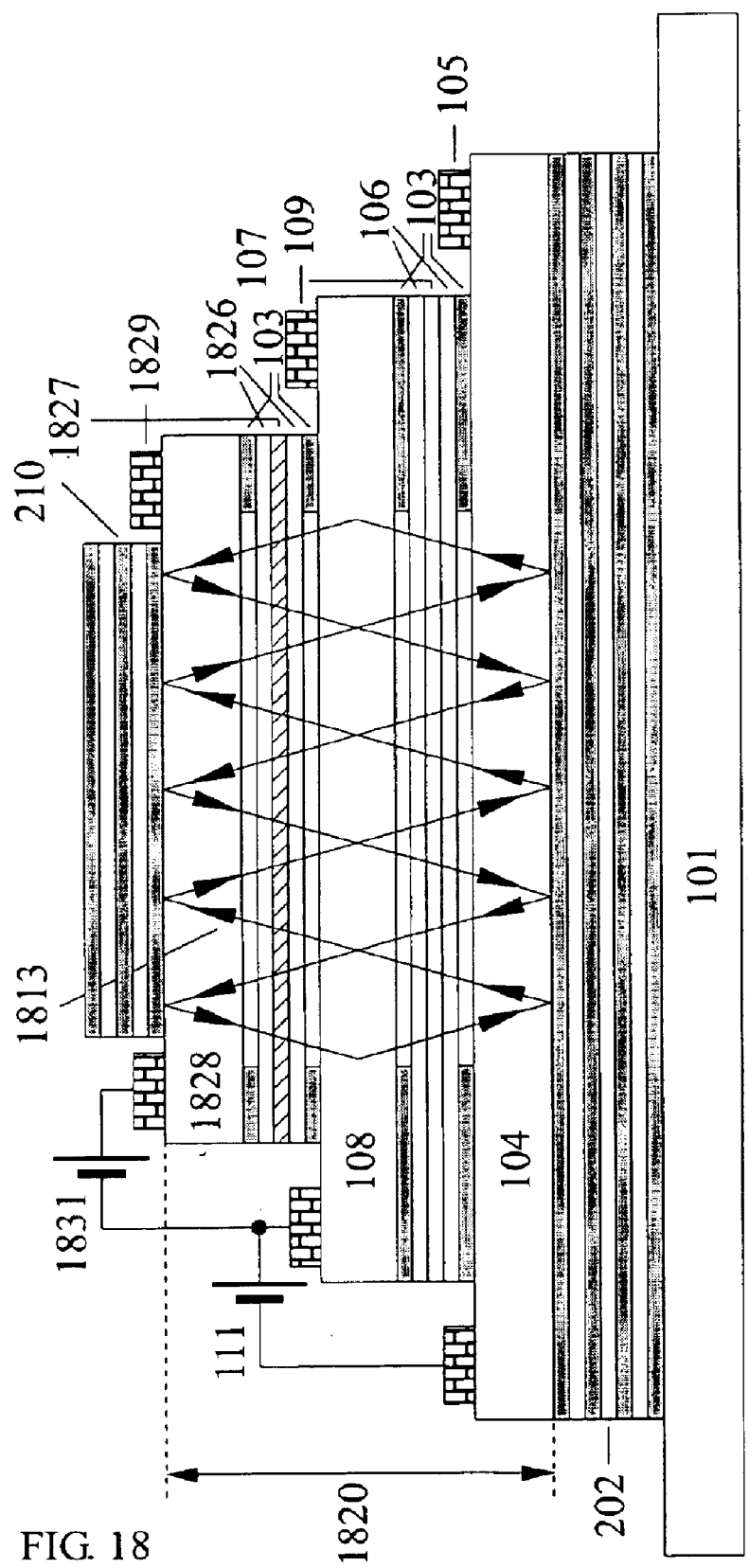
FIG. 18 shows a schematic diagram of another embodiment of the present invention, in which the cavity includes an active element and a phase control element which includes a Stark modulator.

FIG. 18 shows another embodiment of the present invention, in which the cavity (1820) comprises, in addition to the active element, a phase control element. The phase control element is a modulator surrounded on both sides by undoped or weakly doped layers, which are in turn surrounded by n- and p-contact layers. An electric field is used to the tune the refractive index of the modulator. Variations of the refractive index of the modulator change the wavelength of the resonant optical mode (1813). Thus a wavelength-tunable tilted cavity semiconductor laser is realized.

To form the phase control element, two weakly doped layers (1826) surrounding the modulator (1827) are separated from the p-doped current spreading layer (108) by a third current aperture (103). A fourth current aperture (103) separates the weakly doped layer (1826) from a second n-doped current spreading layer (1828), with a third metal contact (1829). The phase control element operates under reverse bias (1831).

The materials of the weakly doped layer (1826) and of the n-doped layer (1828) are preferably lattice-matched or nearly lattice-matched to the substrate and transparent to the emitted light. The weakly doped layer is preferably grown of the same material as layer (106), and the n-doped layer (1828) is preferably grown of the same material as the n-doped layer (104). The metal contacts (1829) are preferably formed from the same structure as the metal contact (105).

The modulator (1827) can be formed by any insertion, the energy band gap of which is narrower than that of a substrate (101). Possible materials and structures are the same as for an active region, but the particular design should be such that the modulator exhibits a strong absorption peak on a high-energy side (on a shorter wavelength side) from the wavelength of the laser radiation.

By applying reverse bias (1831) to the phase control element, the spectral position of the absorption peak is shifted due to the Stark effect. This leads to corresponding changes of the refractive index of the modulator in the spectral vicinity to the absorption peak. Such a variation affects the resonant optical mode (1813) and results in a shift of the wavelength of emitted light.

Typical embodiments of the tilted cavity laser of FIG. 18 include, but are not limited to, structures in which both the active region (107) and the modulator (1827) are placed at local maxima of the intensity of the tilted cavity mode (1827). More precisely, preferred positions must be calculated, by taking into account resonant variations of the absorption coefficient and refractive index of the modulator (1827), i.e., by exact solving of Maxwell's equations for the propagation of light in a multi-layered structure (as described, e.g., by M. Born and E. Wolf, *Principles of Optics* (6th edition, Pergamon Press, (1980) pp. 1–70)).

Figure 19:
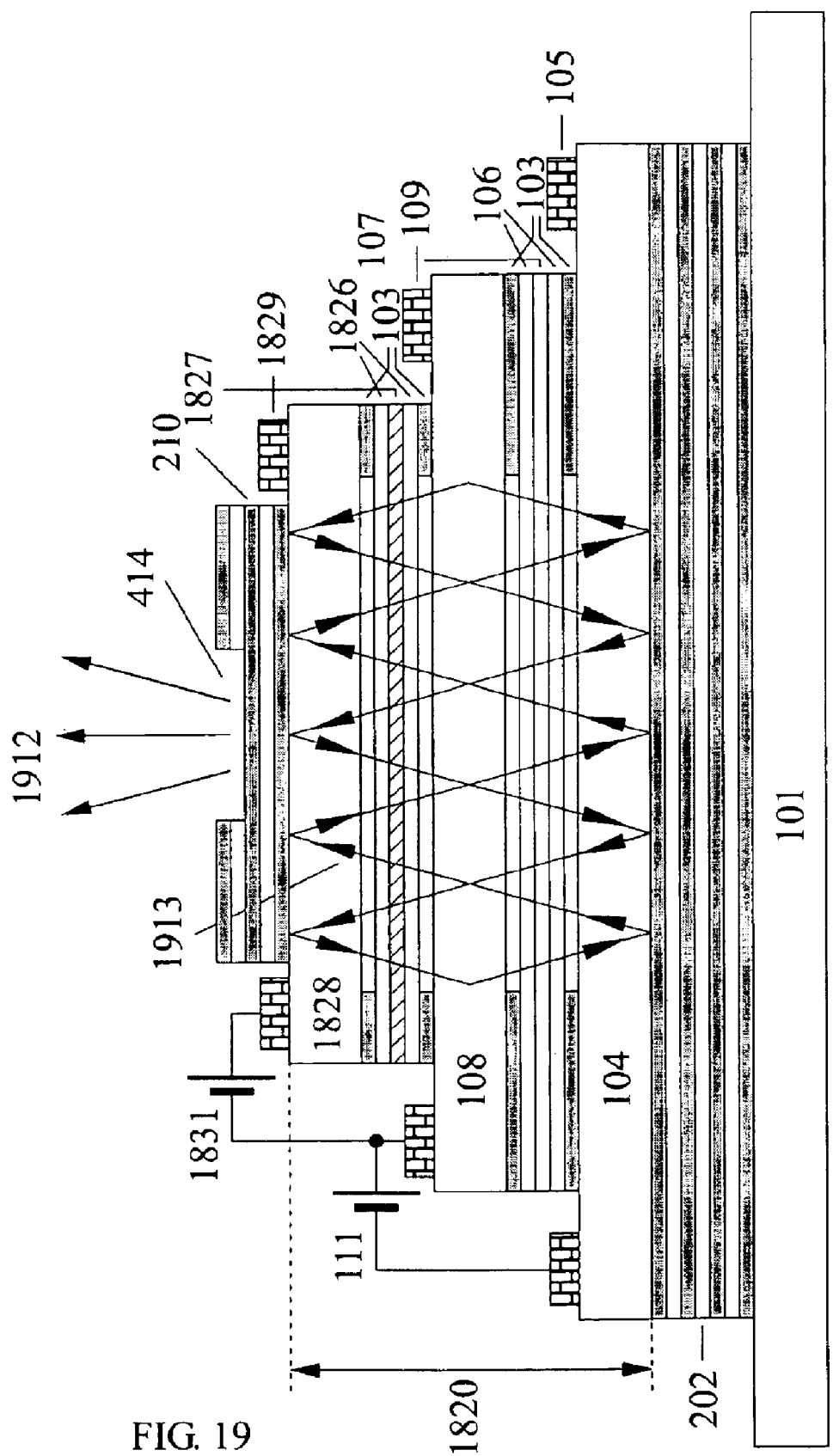
FIG. 19 shows a schematic diagram of another embodiment of the present invention, in which the cavity includes an active element and a phase control element which includes a Stark modulator and an optical aperture on top of the top multilayered interference reflector provides the light output.

Another embodiment of the wavelength-tunable tilted cavity laser is shown in FIG. 19. An optical aperture (414) made by selective partial removal of layers of the top multilayered reflector is added to the laser. The optical aperture (414) provides the light from the resonant tilted optical mode (1913) to come out (1912) in the vertical direction.

Figure 20:
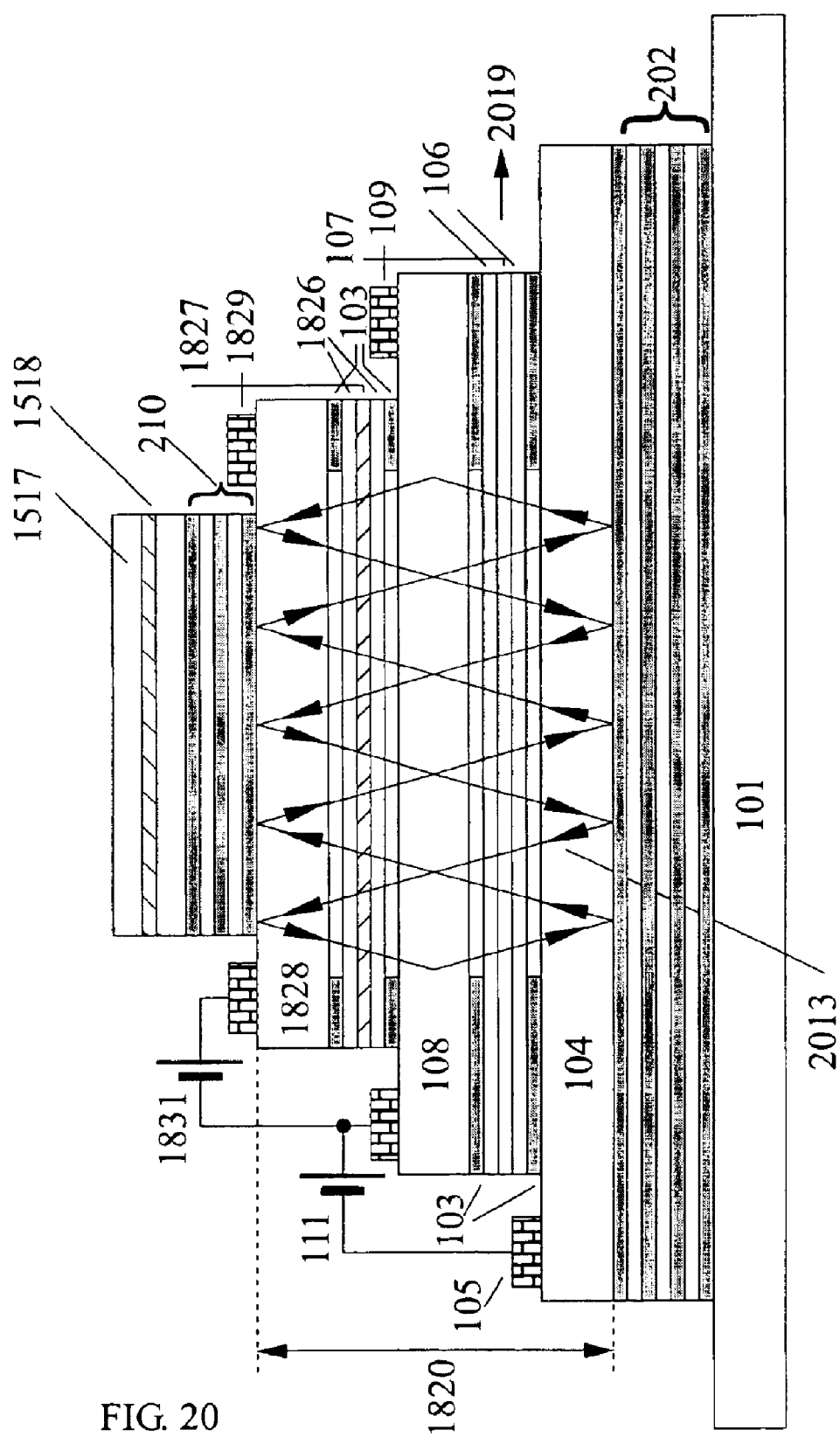
FIG. 20 shows a schematic diagram of another embodiment of the present invention, which includes an absorbing element placed on top of the top reflector.

Another embodiment of the wavelength-tunable tilted cavity laser is shown in FIG. 20. An absorbing element (1517) including an absorbing region (1518) is placed on top of the top reflector (210). The absorbing layer (1518) absorbs light transmitted through the reflector (210) to provide light output in the lateral direction.

Figure 21:
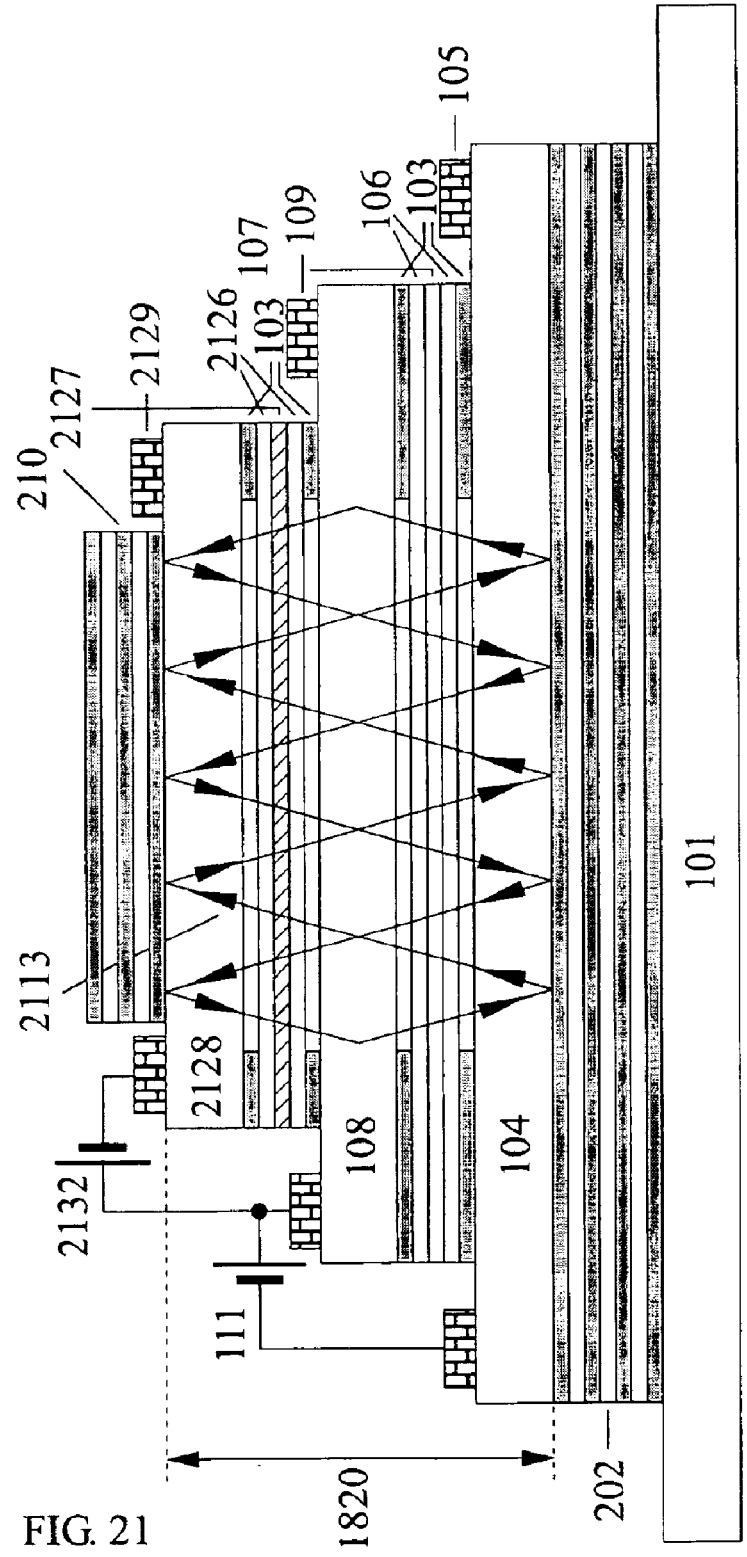
FIG. 21 shows a schematic diagram of another embodiment of the present invention, in which the cavity includes an active element and a phase control element.

Yet another embodiment of a wavelength-tunable tilted cavity laser is shown in FIG. 21. This embodiment includes an active element and a phase control element with a modulator. A forward bias is applied to the phase control element. Forward bias (2132) results in the injection of carriers in the phase control region, the injection of electrons from the metal contact (2129) through the n-doped layer (2128) to the weakly doped layer (2126) and the modulator (2127), and the injection of holes from the metal contact (109) through the p-doped layer (108) to the weakly doped layer (2126) and the modulator (2127). Variations of the refractive index of the modulator (2127) change the wavelength of the resonant optical mode (2113). Recombination of carriers in the modulator (2127) creates bleaching to reduce the exciton absorption peak, up to the vanishing of it and even creation of a second gain region in the system.

The material of the weakly doped layer (2126) is preferably lattice-matched or nearly lattice-matched to the substrate (101) and transparent to the emitted light. The weakly doped layer (2126) is preferably the same material as the layer (106). The material of the n-doped layer (2128) is preferably lattice-matched or nearly lattice-matched to the substrate (101) and transparent to the emitted light. The n-doped layer is preferably the same material and has the same donor impurities as for the n-doped layer (104). The metal contacts (2129) preferably have the same structure as the metal contact (105).

The modulator (2127) can be formed by any insertion, the energy band gap of which is narrower than that of a substrate (101). Possible materials and structures are the same as for an active region, but the particular design should be such that the modulator exhibits a strong absorption peak on a high-energy side (on a shorter wavelength side) from the wavelength of the laser radiation.

In a variation of this embodiment, an optical aperture sitting on top of the top reflector and providing the light output in the vertical direction is included. Another variation includes an absorbing element with an absorbing layer placed on top of the top reflector to provide light output in the lateral direction.

Other embodiments of the wavelength-tunable tilted cavity lasers include those where the refractive index profile within the cavity is non-uniform in the vertical direction, including layers having different refractive indices, thus providing a high selectivity of the emitted wavelength, similar to the embodiments of FIG. 9 and FIG. 10. In one embodiment, the layers of the active element have one refractive index, and the layers of the phase control element have a different refractive index. In other embodiments, either the active element, the phase control element, or both comprise more than one layer having different refractive indices.

Other embodiments of the wavelength-tunable tilted cavity laser include those where the phase control element is placed in the cavity sandwiched between the bottom reflector and the active element. Yet other embodiments of the wavelength-tunable tilted cavity laser include those where the phase control element is placed within the bottom or top reflectors.

Figure 22:
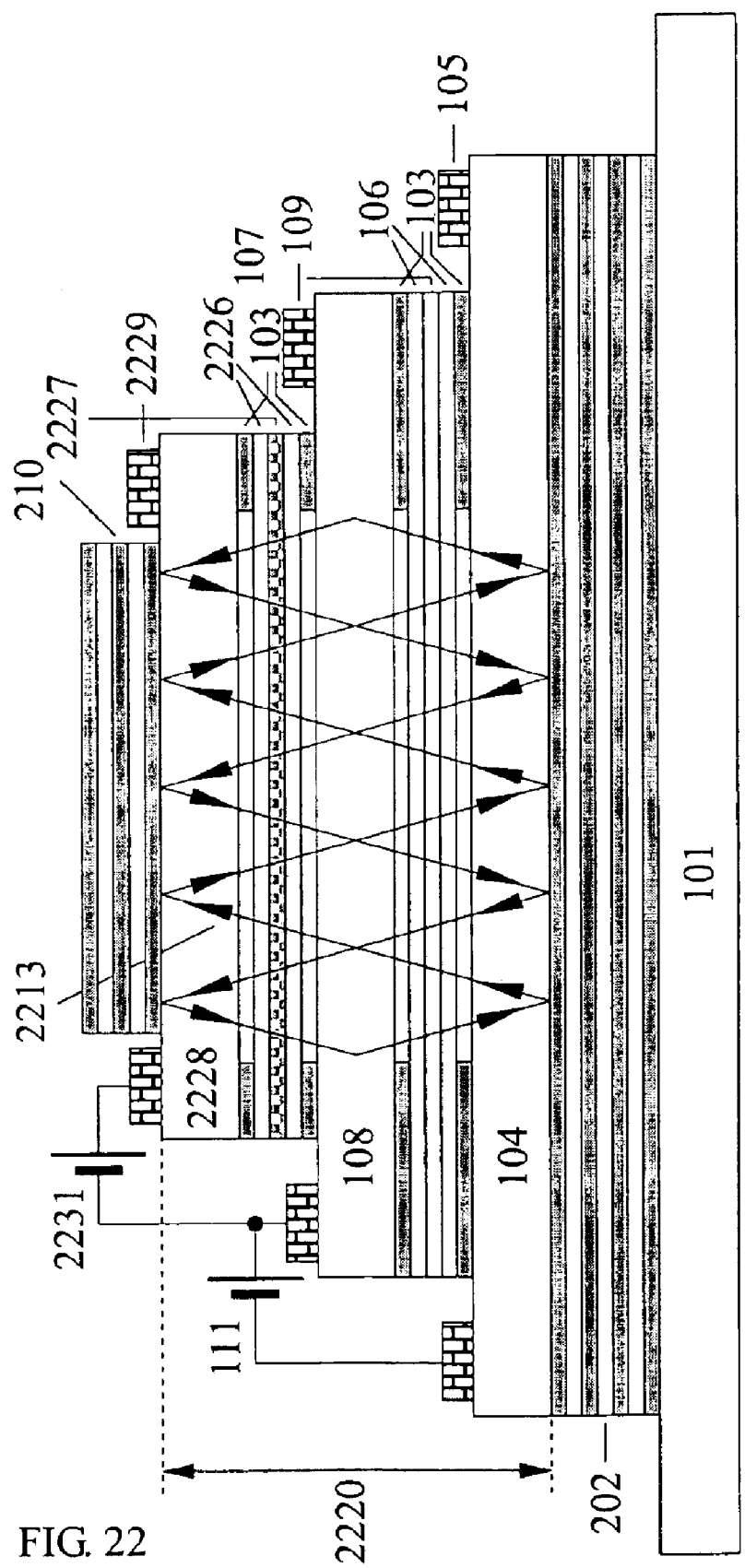
FIG. 22 shows a schematic diagram of another embodiment of the present invention, in which the cavity includes an active element and a power modulating element.

Another embodiment is shown in FIG. 22, in which the microcavity (2220) includes an active element and a power modulating element. The power modulating element is an absorber surrounded from both sides by undoped or weakly doped layers, which are in turn surrounded by n- and p-contact layers. The absorbing layer is a layer exhibiting a narrow absorbing spectra with a moderate peak absorption, such that its influence on the refractive index is negligibly small. An electric field is used to tune the spectral position of the absorption peak and thus to shift it closer to or away from the spectral line of emitted light. Thus the internal optical losses of the resonant optical mode are modulated, resulting in a modulation of the output power.

To form the power modulating element, two weakly doped layers (2226) surrounding the modulator (2227) are separated from the p-doped current spreading layer (108) by a third current aperture (103). A fourth current aperture separates the weakly doped layer (2226) from a second n-doped current spreading layer (2228), with a third metal contact (2229). The power modulating element operates under reverse bias (2231).

The materials of the weakly doped layer (2226) and of the n-doped layer (2228) are preferably lattice-matched or nearly lattice-matched to the substrate and transparent to the emitted light. The weakly doped layer is preferably grown of the same material as layer (106), and the n-doped layer (2228) is preferably grown of the same material as the n-doped layer (104). The metal contacts (2229) are preferably formed from the same structure as the metal contact (105).

The modulator (2227) can be formed by any insertion, the energy band gap of which is narrower than that of a substrate. Possible materials and structures are the same as for an active element, but the particular design should be such that the modulator exhibits a moderate or weak absorption peak on a high-energy side (on a shorter wavelength side) from the wavelength of the laser radiation.

By applying reverse bias (2231) to the power modulating element, the spectral position of the absorption peak is shifted due to the Stark effect. Since the absorption peak is rather weak, its effect on the variation of the refractive index and on the wavelength of the emitted light is negligible. The shift of the absorption peak closer to or away from the spectral position of the emitted light leads to an increase or decrease of the internal losses of the resonant optical mode (2213), respectively. Thus the output power is modulated, and a power-tunable tilted cavity laser is realized.

A variation of this embodiment includes an optical aperture on top of the top reflector, thus providing the light output in the vertical direction. Another variation includes a second absorbing element with an absorbing layer placed on top of the top reflector to provide the light output in the lateral direction.

In another embodiment of the power-tunable tilted cavity laser, the power modulating element operates under a forward bias. This results in a bleaching thus reducing the exciton absorption peak and increasing the output power of the laser. In yet another embodiment, the power modulating element is placed within the bottom or top multilayered reflectors.

Figure 23:
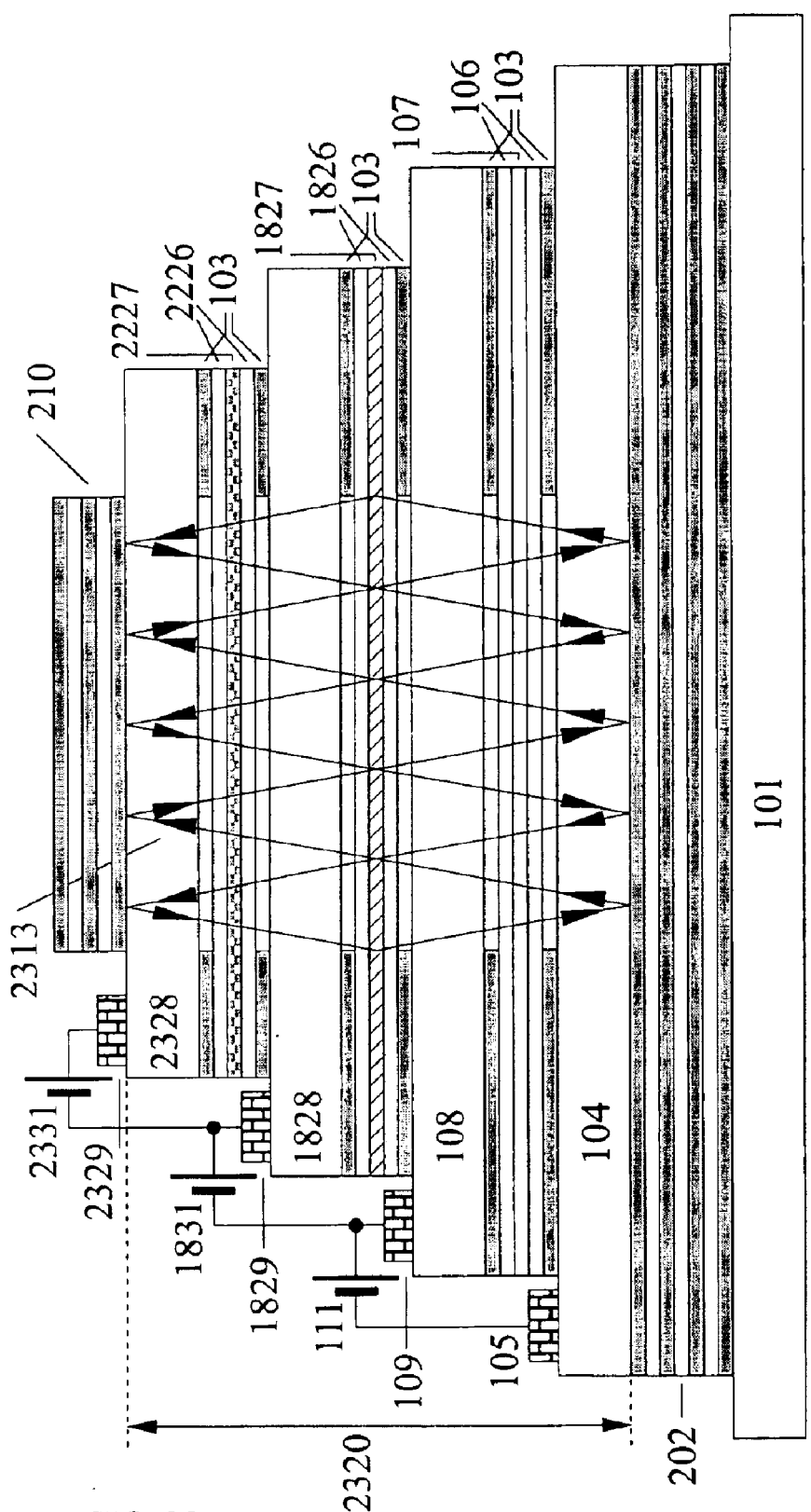
FIG. 23 shows a schematic diagram of another embodiment of the present invention, in which the cavity includes an active element, a phase control element and a power modulating element.

FIG. 23 shows another embodiment of the tilted cavity laser. The difference from the embodiment of FIG. 18 is that the cavity (2320) comprises, along with the active element and the phase control element, a power modulating element sandwiched between the phase control element and the top reflector. In this embodiment, the power modulating element operates under a forward bias (2331). This embodiment realizes an independent modulation of both the wavelength of the emitted light and the output power.

The power modulating element comprises weakly doped layers (2226), a modulator (2227), and a p-doped current spreading layer (2328). The p-doped current spreading layer (2328) is preferably formed from a material, lattice-matched or nearly lattice-matched to the substrate and transparent to the emitted light. The layer (2328) is preferably formed from the same material as the p-doped layer (108). The metal contacts (2329) are preferably formed from the same structure as the metal contact (109).

By applying bias (1831) to the phase control element, and bias (2331) to the power modulating element, an independent tuning of the wavelength of the emitted light and of the output power is realized.

Figure 24:
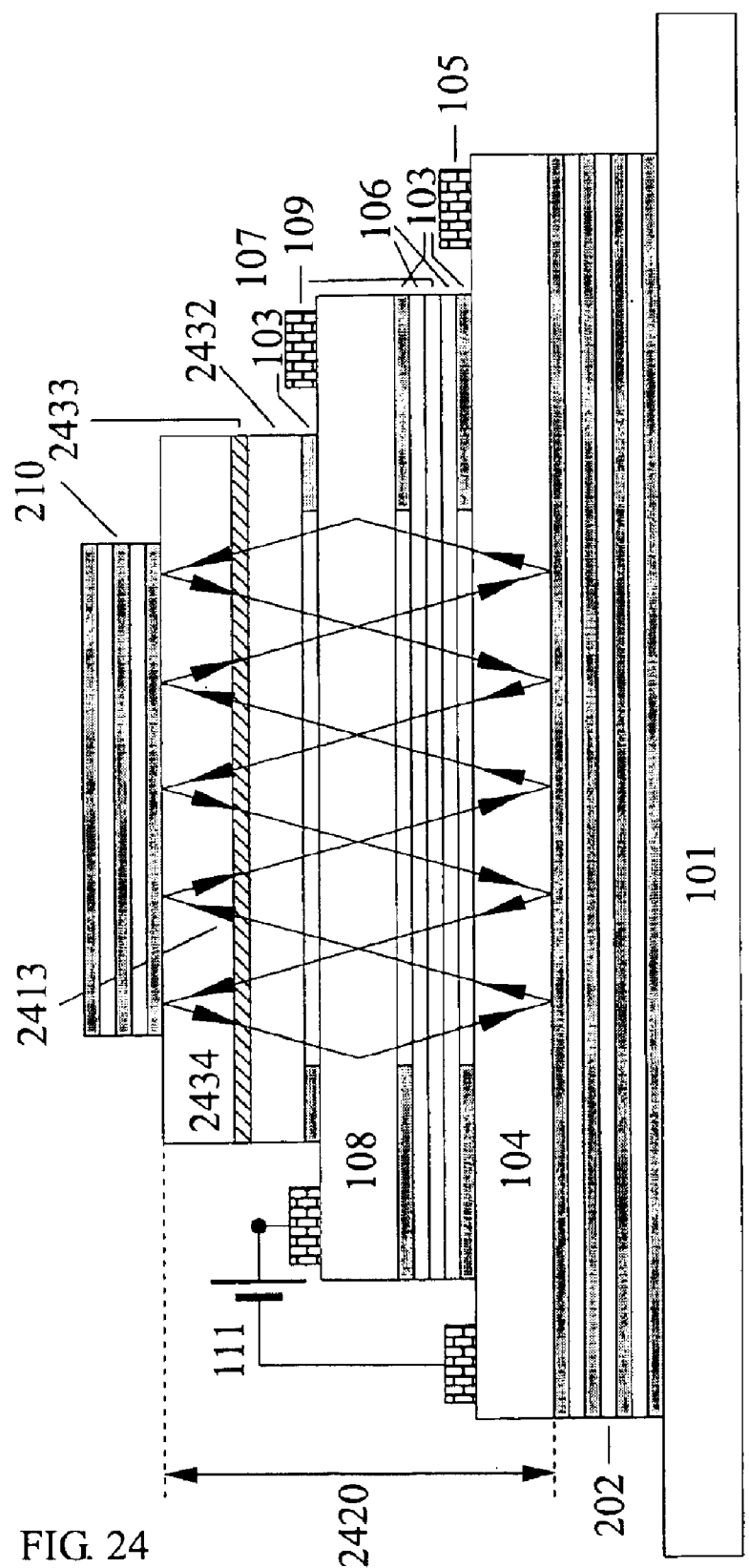
FIG. 24 shows a schematic diagram of another embodiment of the present invention, in which the cavity includes an active element and a modulator providing an enhanced temperature stabilization of the wavelength of emitted light.
Figure 25:
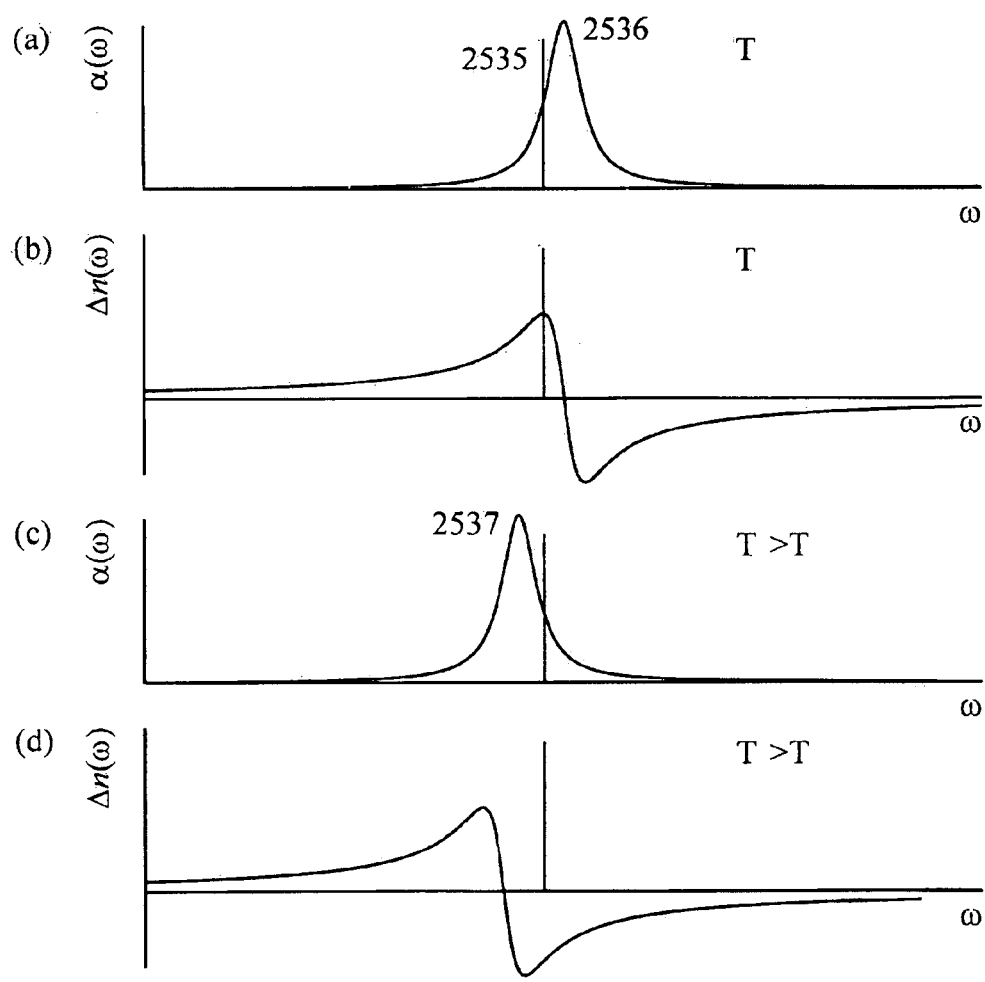
FIG. 25 shows the principle of the wavelength stabilization against variations of temperatures by using a modulator.

FIG. 24 shows another embodiment of the tilted cavity laser. The cavity (2420) comprises a n-doped current spreading layer (104), a weakly-doped or undoped confinement layer (106) comprising an active region (107), a p-doped current spreading layer (108), weakly doped or undoped layers (2432) and (2434), and a modulator (2433). The light in the tilted optical mode (2413) passes through both the active region (107) and the modulating layer (2433). Unlike the embodiments of FIGS. 18–23, applying a bias on a modulator is not necessary. FIG. 25 illustrates the principle of operating of the laser shown in the embodiment of FIG. 24. The modulator (2433) is a layer exhibiting a resonant absorption of light (2536) at larger photon energies than the emitted light (2535) (FIG. 25(a)). The absorption peak results in a strong dispersion of the refractive index in the vicinity of the absorption peak (FIG. 25(b)). The laser operation typically leads to an increase of temperature of the laser structure and to corresponding variations of the refractive indices of all semiconductor layers. The main reason is the decrease of the energy band gap with temperature. Correspondingly, the position of the absorption peak of the modulator is shifted at $T_2 > T_1$ towards lower photon energies (2537) (FIG. 25(c)). The laser is designed such that the spectral position of the emitted light (2535) lies in the spectral region, in which the refractive index of the modulator decreases with the photon energy. The refractive index of the modulator (2433) at the energy of the emitted light decreases with the increase of temperature (FIG. 25(d)). All other layers comprising the cavity (2420) are far from the resonance with the emitted light, and their refractive indices increase with an increase in temperature. Thus, a resonant decrease of the refractive index of a thin modulating layer (2433) may compensate a non-resonant increase of the refractive index of all other layers of the cavity (2420). This enhances the temperature stability of the wavelength of the emitted light.

Layers (2432) and (2434) are preferably formed from a material, lattice-matched to the substrate, and transparent to the emitted light. A particular embodiment includes, but is not limited to, layers made from the same material as the substrate (101). The modulator layer (2433) is preferably formed by any insertion, the energy band gap of which is narrower than that of the substrate (101). Possible modulators include, but are not limited to, a single-layer or a multi-layer system of quantum wells, quantum wires, quantum dots, or any combination thereof. In a device on a GaAs-substrate, examples of the modulator (2433) include, but are not limited to, a system of insertions of InAs, $In_{1-x}Ga_xAs$, $In_xGa_{1-x-y}Al_yAs$, $In_xGa_{1-x}As_{1-y}N_y$, or similar materials.

Figure 26:
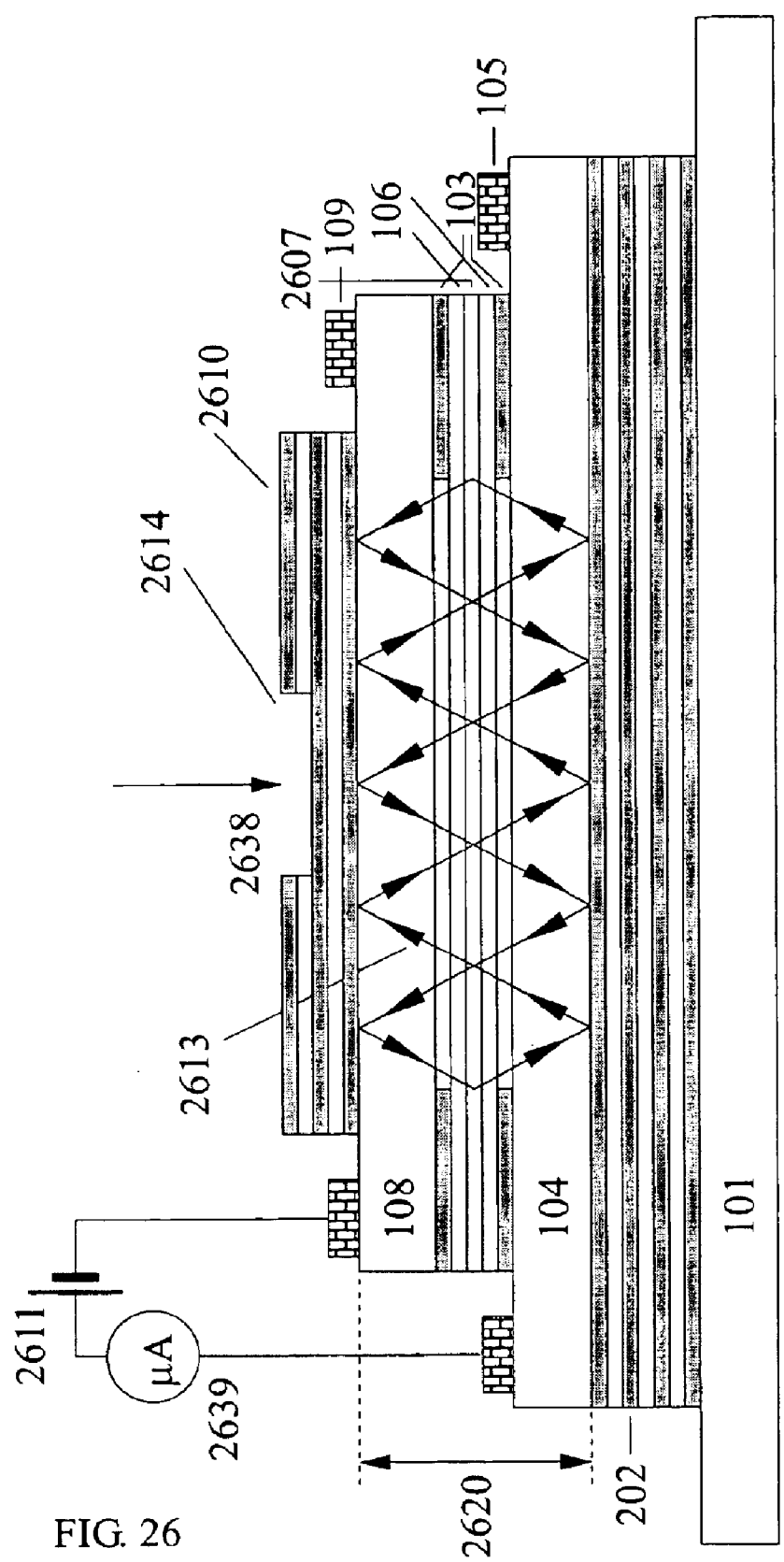
FIG. 26 shows a schematic diagram of another embodiment of the present invention, in which the tilted cavity device works as a wavelength-selective photodetector detecting incident light coming in the vertical direction.

Another embodiment of the present invention is shown in FIG. 26. The concept of the tilted cavity device is used in a photodetector. Unlike the tilted cavity laser shown in FIG. 4, the photodetector of FIG. 26 operates under a reverse bias (2611). External light (2638) diffracts at the aperture (2614). The bottom (202) and the top (2610) multi-layered resonant reflectors define a tilted optical mode (2613) of the cavity (2620). This design gives a photodetector that absorbs selectively external light that is in resonance with the tilted optical mode (2613). Absorption of light by the absorbing region (2607) results in generation of a photocurrent, which is measured by a microampermeter (2639).

Possible realizations of the absorbing region (2607) include, but are not limited to, a single-layer or a multi-layer system of quantum wells, quantum wires, quantum dots, or any combination thereof. In a case of the device on a GaAs-substrate, examples of the absorbing region (2607) include, but are not limited to, a system of insertions of InAs, $In_{1-x}Ga_xAs$, $In_xGa_{1-x-y}Al_yAs$, $In_xGa_{1-x}As_{1-y}N_y$, or similar materials.

Figure 27:
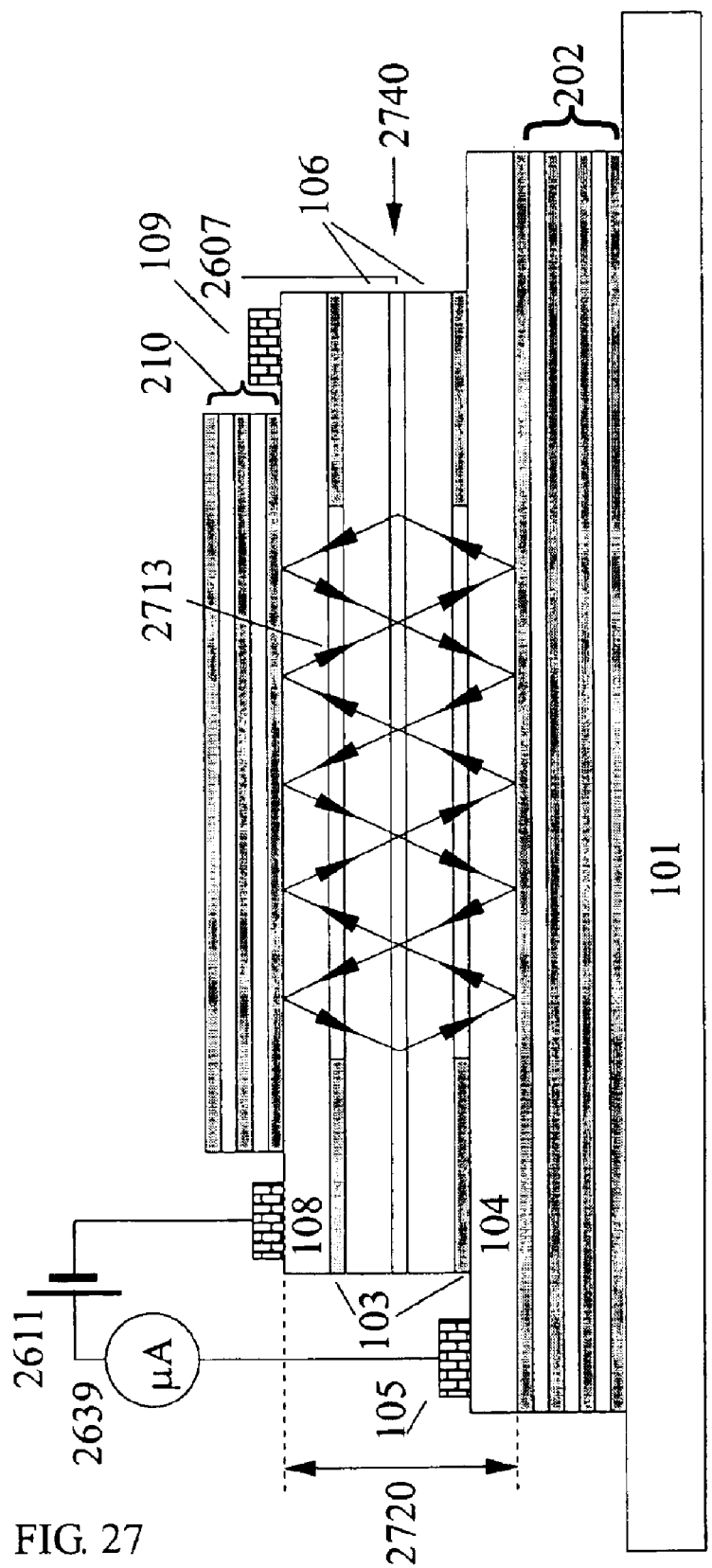
FIG. 27 shows a schematic diagram of another embodiment of the present invention, in which the tilted cavity device works as a wavelength-selective photodetector detecting light coming in the lateral direction.

FIG. 27 shows another embodiment of the present invention, in which the external light (2740) comes through the side surface, excites the tilted optical mode (2713) of the cavity (2720), is absorbed by the absorbing region (2607), and generates photocurrent, which is measured by a microampermeter (2639).

Figure 28:
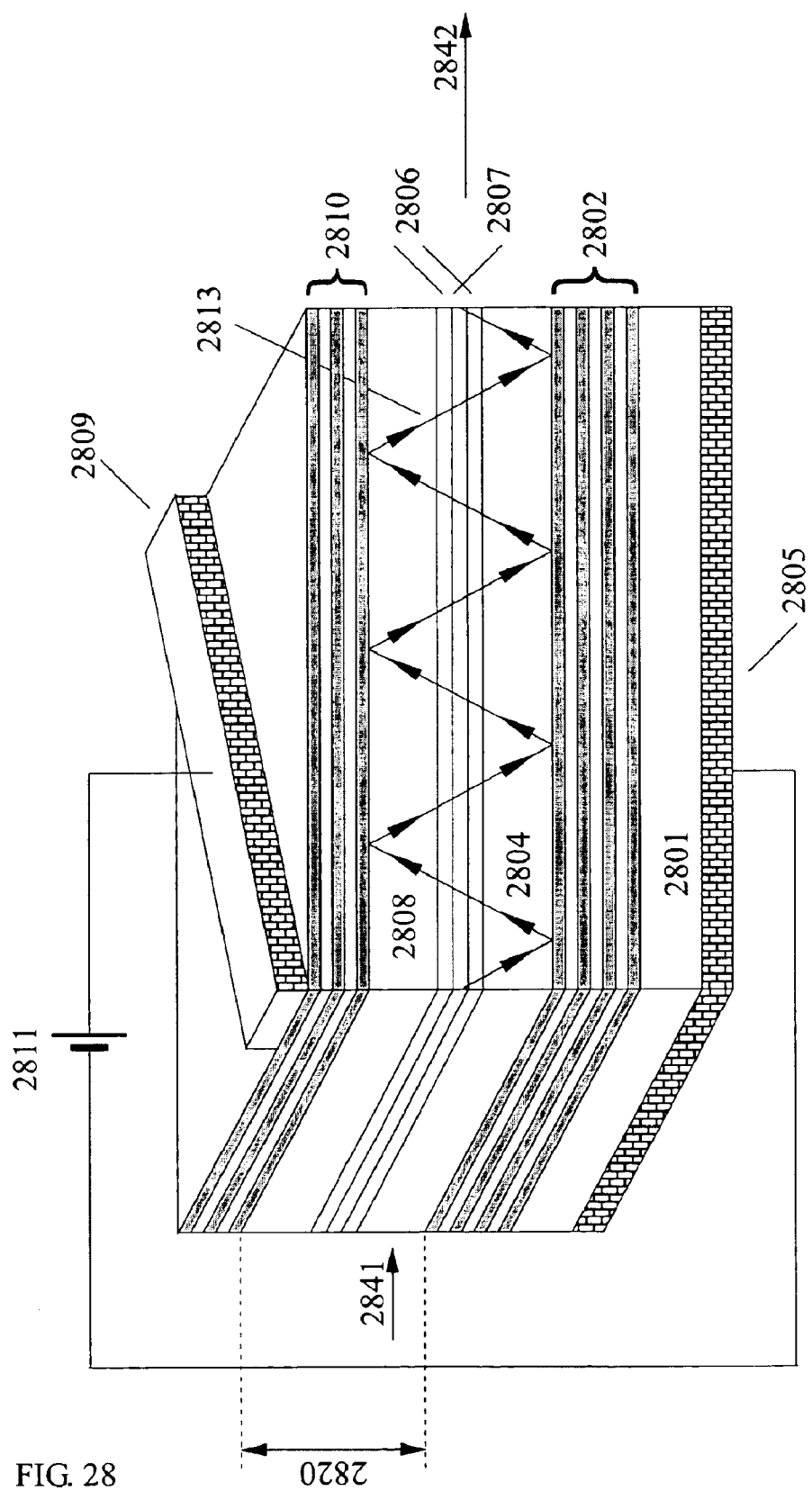
FIG. 28 shows a schematic diagram of another embodiment of the present invention, in which the tilted cavity device works as a wavelength-selective amplifier.

FIG. 28 shows another embodiment of the present invention. This is an amplifier using the concept of a tilted cavity optical mode. The optical cavity (2820) is placed between the bottom multi-layered resonance reflector (2802) and the top multi-layered resonant reflector (2810). The structure comprises a sequence of an n-contact (2805), an n-doped substrate (2801), an n-doped bottom multi-layered resonant reflector (2802), an n-doped layer (2804), an undoped or a weakly doped confinement layer (2806), in which an active region (2807) is placed, a p-doped layer (2808), a p-doped top multi-layered resonant reflector (2810), and a p-contact (2809). Unlike the other embodiments of the present invention, the substrate (2801) and the bottom reflector (2802) are n-doped, the top reflector (2810) is p-doped, and the contacts (2805) and (2809) are placed below the substrate (2801) and above the top reflector (2810), respectively. Forward bias (2811) is applied to the active region (2807) via the contacts (2805) and (2809). The cavity (2820), the bottom multi-layered reflector (2802) and the top reflector (2810) are designed such that a tilted optical mode (2813) is the resonant mode of the structure. The top contact (2809) is rotated in the lateral plane with respect to the lateral direction of propagation of light in the resonant optical mode, so that no feedback in the lateral direction occurs. Thus, the device does not work as a laser. Upon a forward bias (2811) applied to the active region (2807), the device works as an amplifier. The input light (2841) transforms into a resonant tilted cavity mode (2813) and light comes out (2842) with an increased intensity. The transformation of the incident light into the tilted optical mode (2813) and the transformation of the latter into the outgoing light (2842) create an amplifier with a high selectivity in the wavelength of light.

The substrate (2801) is preferably formed from the same material as the substrate (101) of the other embodiments of the present invention and is transparent to the incident light, but is preferably n-doped. The bottom multi-layered reflector (2802) is preferably formed from alternating layers of high and low refractive indices of materials, transparent to the incident light, lattice-matched or nearly lattice matched to the substrate, and n-doped. Typical designs include, but are not limited to, a multi-layered semiconductor mirror $GaAs/Ga_{1-x}Al_xAs$ for devices on GaAs substrate or a multilayered structure of a quaternary alloy $In_xGa_{1-x-y}Al_yAs$ with alternating composition for devices on an InP substrate, all layers being n-doped. The layer (2804) is preferably formed from a material, lattice-matched, or nearly lattice matched to the substrate, transparent to the incident light, and is n-doped.

The confinement layer (2806) is preferably formed from any material, lattice-matched or nearly lattice matched to the substrate, transparent to the incident light, and undoped or weakly doped. In preferred embodiments, the confinement layer (2806) is formed from the same material as the substrate (2801), but is undoped or weakly doped. The layer (2808) is preferably formed from a material, lattice-matched or nearly lattice matched to the substrate, transparent to the incident light, and p-doped.

The top multi-layered reflector (2810) is preferably formed from alternating layers of high and low refractive indices of materials, transparent to the incident light, and p-doped. Typical design includes layers formed from the same materials as those of the bottom reflector, but p-doped.

The active region (2807) is preferably formed by any insertion, the energy band gap of which is narrower than that of the substrate (2801). Possible active regions (2807) include, but are not limited to, a single-layer or a multi-layer system of quantum wells, quantum wires, quantum dots, or any combination thereof. In a device on a GaAs-substrate, examples of the active region (2807) include, but are not limited to, a system of insertions of InAs, $In_{1-x}Ga_xAs$, $In_xGa_{1-x-y}Al_yAs$, $In_xGa_{1-x}As_{1-y}N_y$, or similar materials.

The n-contact (2805) is preferably made from the same material as n-contacts (105) of the other embodiments of the present invention. The p-contact (2809) is preferably made from the same material, as p-contacts (109) of the other embodiments of the present invention.

Variations of a tilted cavity laser with an independent tuning of the wavelength of emitted light and the output power are possible, where both the phase control element and the power modulating element operate under both the reverse and the forward bias. In another embodiment, an optical aperture is placed on top of the top reflector to provide light output in the vertical direction. Another embodiment has a second absorbing element including an absorbing layer placed on top of the top reflector to provide light output in the lateral direction. In other variations, the cavity comprises more than one layer having different refractive indices.

In alternative embodiments of the present invention, only a part of the laser structure is formed from a tilted cavity. Additional embodiments where the active region and the tilted cavity are spatially separated and are placed in different parts of the laser structure are also encompassed by the present invention. Another embodiment of the present invention comprises an optical fiber having a multilayered coating. The multilayered coating is designed such that only light in a certain interval of wavelengths can propagate, thus providing a wavelength-stabilized system.

Alternative embodiments of the present invention are related to the physical nature of the total internal reflection. The total internal reflection of light at the boundary between the two media implies that the light coming from the first medium to the boundary is reflected back to the same first medium and does not propagate in the second medium. This is related, however, only to the far field in the second medium, where light vanishes. In the near field zone, close to the boundary, light is present in a form of evanescent electromagnetic wave, which exhibits an exponential or an oscillatory decay away from the boundary. In this near field zone light can be coupled to one another medium and guided away from the boundary.

Figure 29:
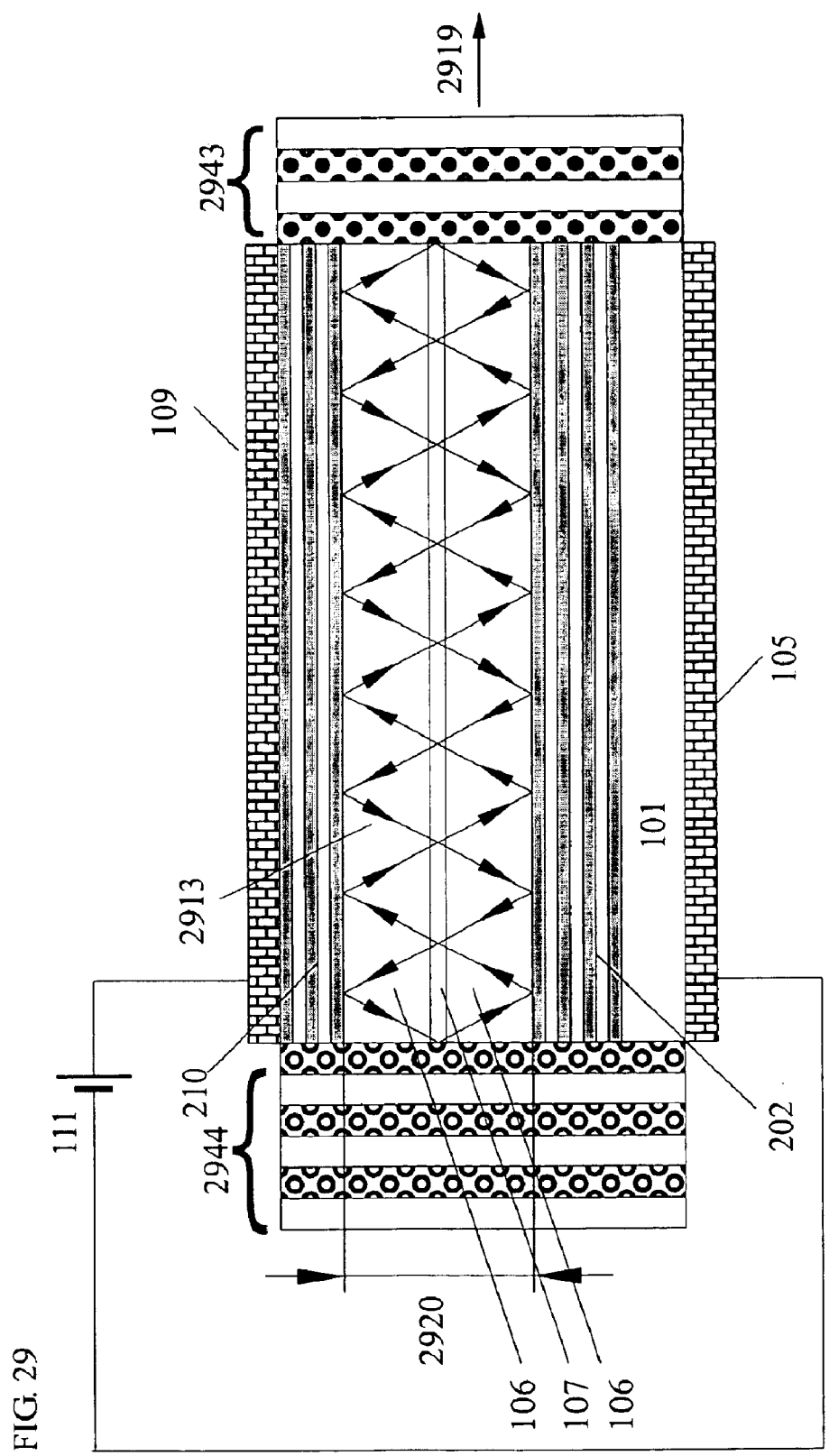
FIG. 29 shows a schematic diagram of another embodiment of the present invention, in which a coating is deposited on the side surface of the tilted cavity.

For example, as shown in FIG. 29, it is possible to cover at least one side surface of a tilted cavity (2920) by a single-layer or a multiple-layer coating (2943) and/or (2944). The tilted cavity (2920) is covered at the front facet by a multilayered coating (2943) and at the rear facet by a multilayered coating (2944). The tilted cavity (2920), the top mirror (202), the bottom mirror (210), and the coatings (2943) and (2944) are designed such that a tilted optical mode (2913) has minimum losses. Lasing occurs in this mode, and laser light comes out (2919) through the coating (2943). Such coverage modifies transmission of light through the side surface from the tilted cavity. By varying a number of layers in the coating, their thickness and refractive indices, it is possible to control the light output in the lateral direction.

Figure 30:
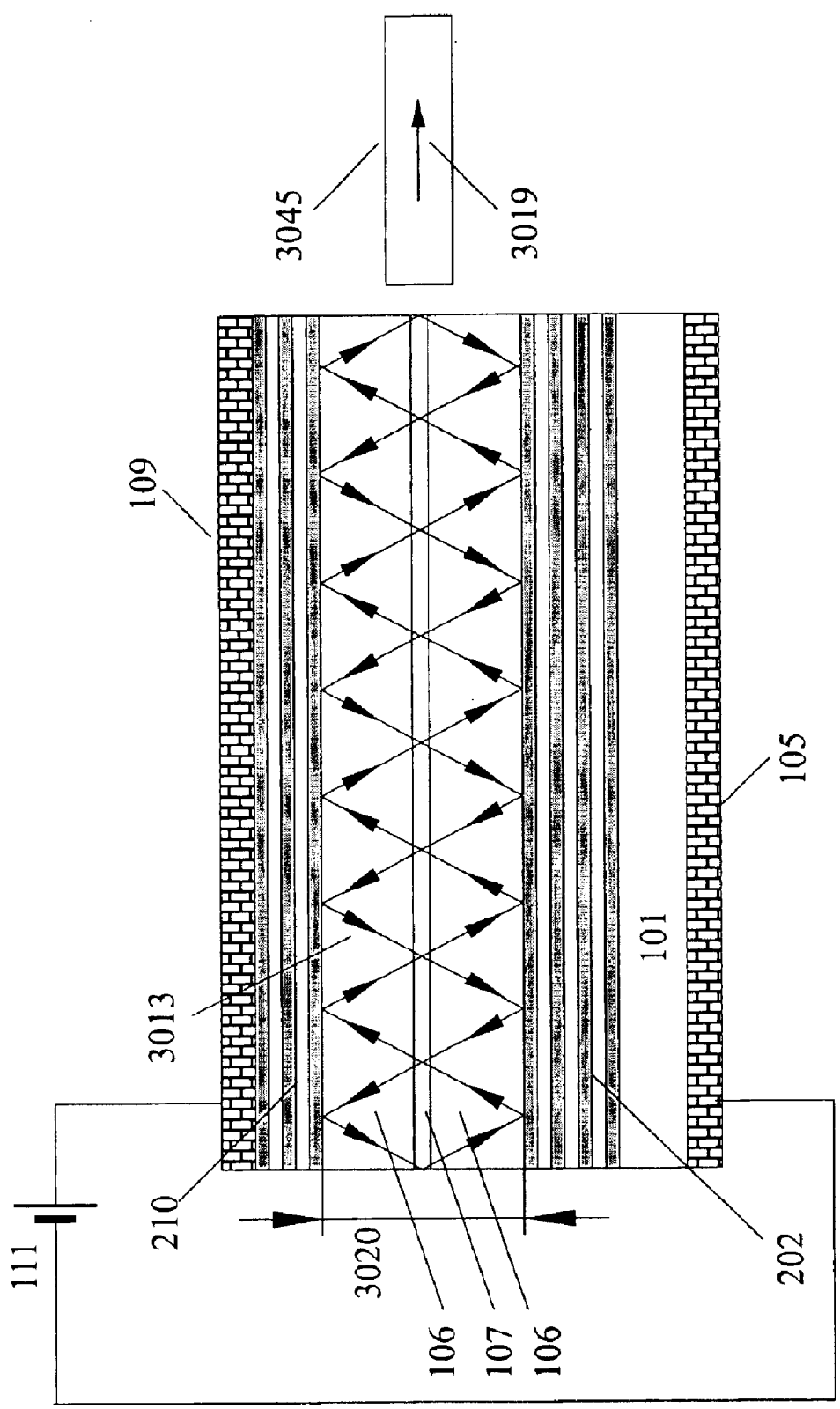
FIG. 30 shows a schematic diagram of another embodiment of the present invention, in which an optical fiber is placed in the vicinity of the side surface of the tilted cavity, and emitted laser light is diffracted at the optical fiber aperture and propagates along the fiber.
Figure 31:
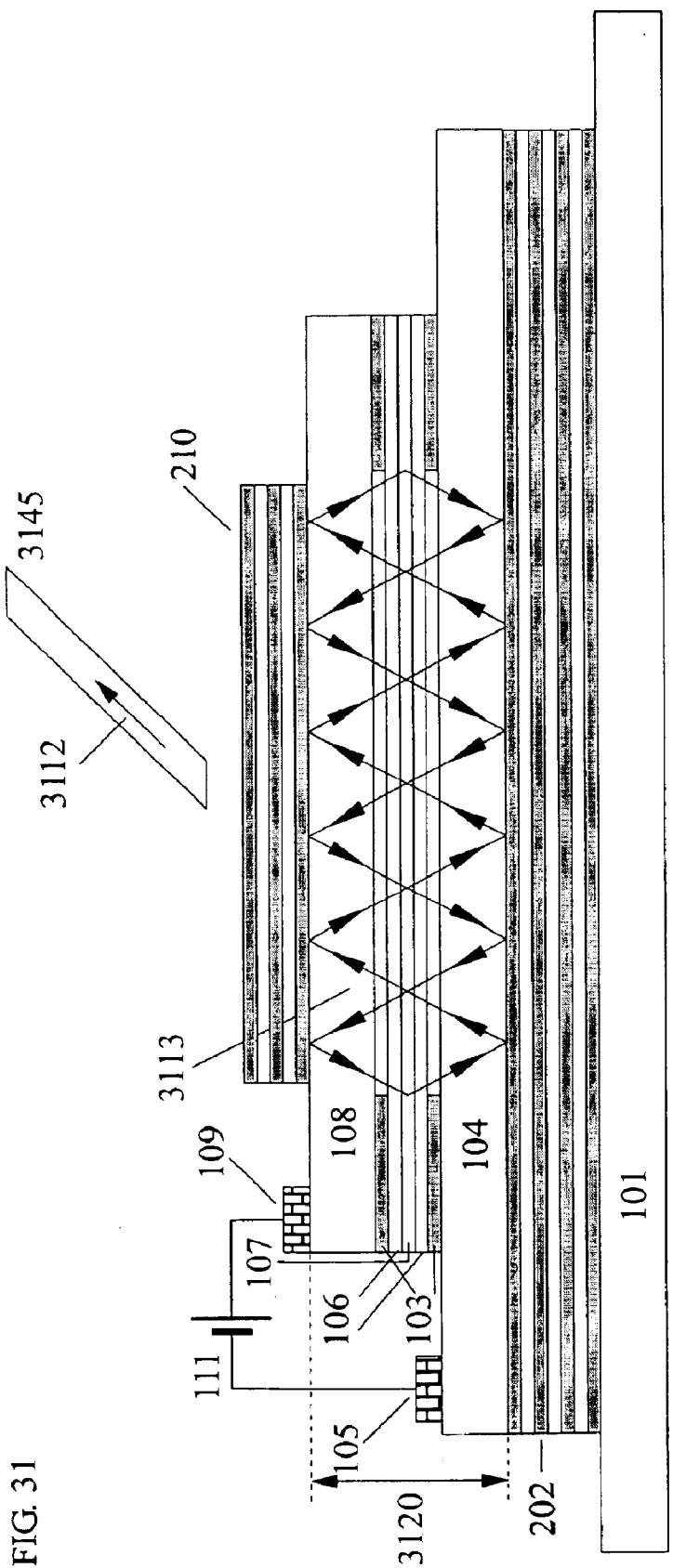
FIG. 31 shows a schematic diagram of another embodiment of the present invention, in which an optical fiber is placed in the vicinity of the top surface of the top reflector, and emitted laser light is diffracted at the optical fiber aperture and propagates along the fiber.
Figure 32:
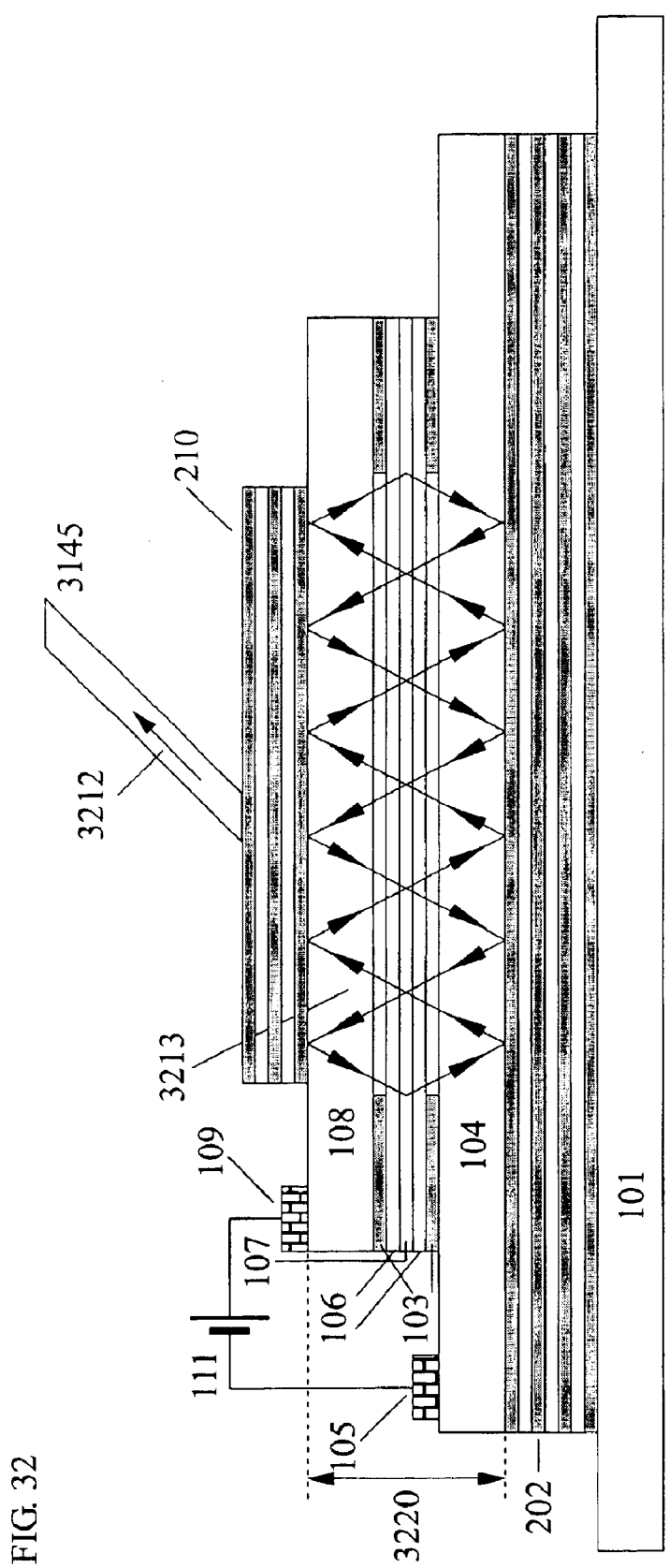
FIG. 32 shows a schematic diagram of another embodiment of the present invention, in which an optical fiber is placed on top of the top surface of the top reflector, and emitted laser light is diffracted at the optical fiber aperture and propagates along the fiber.

Another possibility is related to the light output through the top or facet reflector. By attaching one or a few optical fibers in the vicinity or directly on the top surface of the top reflector or close to the side facet, light from the resonant tilted optical mode of the tilted cavity undergoes diffraction at the optical fiber aperture and propagates along the fibers. FIG. 30 shows an optical fiber (3045) attached in the vicinity of the side surface of the tilted cavity (3020). Laser light in the tilted optical mode (3013) undergoes diffraction at the optical fiber aperture and propagates (3019) along the fiber. In FIG. 31, an optical fiber (3145) is placed in the vicinity of the top surface of the top reflector (210). The tilted cavity (3120), the bottom reflector (202) and the top reflector (210) are designed such that none of the tilted optical modes, without a fiber, come out of the tilted cavity (3120). Outside the tilted cavity (3120), the light of the optical modes is present only in a form of evanescent electromagnetic wave, which exhibits an exponential or an oscillatory decay away from the boundary. Due to an optical fiber (3145) placed in the vicinity of the top surface of the top reflector (210), one of the tilted optical modes (3113) undergoes diffraction at the optical fiber aperture and propagates (3112) along the fiber. In FIG. 32, optical fiber (3245) is placed directly on top of the top reflector (210). Light in the tilted optical mode (3213) formed within a tilted cavity (3220) is diffracted at the optical fiber aperture and propagates (3212) along the fiber. The optical fibers (3045), (3145) and (3245) are attached in a near field zone of an electromagnetic field, thus providing coupling of a resonant optical mode of the cavity to the optical fiber.

For each of the described embodiments of a tilted cavity semiconductor laser, photodetector, or amplifier, the preferred sequence of the elements, the thickness of each layer, the design of the cavity, reflectors and modulators are obtained as a result of the optimization providing the preferred interplay between the strongest stabilization of the emitted wavelength, maximum output power, and, if necessary, maximum tunability of the wavelength and power of emitted light.

Although the invention has been illustrated and described with respect to exemplary embodiments thereof, it should be understood by those skilled in the art that the foregoing and various other changes, omissions and additions may be made therein and thereto, without departing from the spirit and scope of the present invention. Therefore, the present invention should not be understood as limited to the specific embodiments set out above but to include all possible embodiments which can be embodied within a scope encompassed and equivalents thereof with respect to the features set out in the appended claims.

What is claimed is:

1. A semiconductor laser comprising:
   a) a bottom reflector;
   b) a top reflector;
   c) a cavity located between the bottom reflector and the top reflector; and
   d) an active region that emits light;

wherein the semiconductor laser is operated in at least one resonant optical mode, such that:
   i) light is emitted from the active region;
   ii) light in the resonant optical mode propagates in the cavity in a direction tilted with respect to both a direction normal to a lateral plane and the lateral plane itself;
   iii) the resonant optical mode has minimum optical losses compared with optical losses of the other optical modes; and
   iv) a wavelength and a tilt angle of propagation of the light is stabilized.

2. The semiconductor laser of claim 1, further comprising a substrate below the bottom reflector.

3. The semiconductor laser of claim 2, wherein:
   a) the active region emits light when exposed to an injection current when a forward bias is applied; and
   b) the cavity comprises:
      i) a first confinement region below the active region;
      ii) a second confinement region above the active region;
      iii) a first n-doped current spreading region above the substrate and below the first confinement region;
      iv) a first p-doped current spreading region above the second confinement region and below the top reflector;
      v) a first current aperture placed between each neighboring region of the cavity; and
      vi) a bias control device between the first n-doped current spreading region and the first p-doped current spreading region such that current can be injected into the active region to generate light.

4. The semiconductor laser of claim 1, wherein the active region is selected from the group consisting of:
   a) at least one quantum well;
   b) at least one sheet of quantum wires;
   c) at least one sheet of quantum dots; and
   d) any combination of a) through c).

5. The semiconductor laser of claim 4, wherein the bottom reflector and the top reflector provide a first feedback mechanism in a vertical direction, and the feedback mechanism in a lateral direction is provided by at least two side mirrors of the cavity.

6. The semiconductor laser of claim 1, wherein the bottom reflector and the top reflector are multilayered.

7. The semiconductor laser of claim 6, wherein the bottom reflector comprises a periodic structure of layers, wherein the layers alternate between layers having a first refractive index and layers having a second refractive index, wherein the second refractive index is lower than the first refractive index.

8. The semiconductor laser of claim 6, wherein the top reflector comprises a periodic structure of layers, wherein the layers alternate between layers having a first refractive index and layers having a second refractive index, wherein the second refractive index is lower than the first refractive index.

9. The semiconductor laser of claim 7, wherein the top reflector comprises a periodic structure of layers, wherein the layers alternate between layers having a third refractive index and layers having a fourth refractive index, wherein the fourth-refractive index is lower than the third refractive index.

10. The semiconductor laser of claim 9, wherein:
  a) the cavity comprises at least one layer having a fifth refractive index, and at least one layer having a sixth refractive index, wherein:
    i) the fifth refractive index is higher than the second refractive index; and
    ii) the fifth refractive index is higher than the fourth refractive index;
    iii) the sixth refractive index is lower than the first refractive index;
    iv) the sixth refractive index is lower than the third refractive index;
    v) the sixth refractive index is lower than the fifth refractive index;
    vi) the sixth refractive index is higher than the second refractive index; and
    vii) the sixth refractive index is higher than the fourth refractive index;
  b) the bottom reflector comprises a topmost layer having the first refractive index; and
  c) the top reflector comprises a bottommost layer having the third refractive index.

11. The semiconductor laser of claim 10, wherein the active region is located within the layer having the fifth refractive index.

12. The semiconductor laser of claim 10, wherein the active region is located within the layer having the sixth refractive index.

13. The semiconductor laser of claim 9, wherein:
  a) the cavity comprises at least one layer having a fifth refractive index and at least one layer having a sixth refractive index, wherein:
    i) the fifth refractive index is lower than the first refractive index;
    ii) the fifth refractive index is lower than the third refractive index;
    iii) the sixth refractive index is lower than the first refractive index;
    iv) the sixth refractive index is lower than the third refractive index;
    v) the sixth refractive index is higher than the second refractive index;
    vi) the sixth refractive index is higher than the fourth refractive index; and
    vii) the sixth refractive index is higher than the fifth refractive index;
  b) the bottom reflector comprises a topmost layer having the first refractive index; and
  c) the top reflector comprises a bottommost layer having the third refractive index.

14. The semiconductor laser of claim 13, wherein the active region is located within the layer having the fifth refractive index.

15. The semiconductor laser of claim 13, wherein the active region is located within the layer having the sixth refractive index.

16. The semiconductor laser of claim 13, wherein the active region is located between the layer having the fifth refractive index and the layer having the sixth refractive index.

17. The semiconductor laser of claim 1, wherein the laser emits light in a vertical direction, such that the laser acts as a surface emitting laser.

18. The semiconductor laser of claim 1, further comprising an optical aperture, which allows the generated light to come out of the structure, wherein the optical aperture is made by partial selective removal of several layers of the top reflector.

19. The semiconductor laser of claim 1, further comprising an optical aperture, which allows the generated light to come out of the structure, wherein the optical aperture is made by an additional layer located on top of the top reflector.

20. The semiconductor laser of claim 1, wherein the laser emits light in a lateral direction, such that the laser acts as an edge-emitting laser.

21. The semiconductor laser of claim 1, wherein the feedback in the vertical direction is provided by multi-layered bottom and top reflectors.

22. The semiconductor laser of claim 1, wherein the top reflector comprises a single layer and the bottom reflector comprises multiple layers, such that the reflectors provide feedback in a vertical direction.

23. The semiconductor laser of claim 1, wherein the top reflector comprises multiple layers and the bottom reflector comprises a single layer, such that the reflectors provide feedback in a vertical direction.

24. The semiconductor laser of claim 1, wherein the top reflector and the bottom reflector each comprise a single layer, thus providing feedback in a vertical direction.

25. The semiconductor laser of claim 24, in which a tilted optical mode is tilted normal to the layers at an angle larger than the angle of a total internal reflection both at a boundary between the cavity and the top reflector, and a boundary between the cavity and the bottom reflector.

26. The semiconductor laser of claim 1, wherein the cavity comprises at least one mirror on each side of the cavity which provide feedback in a lateral direction.

27. The semiconductor laser of claim 1, wherein the top reflector is partially etched to provide a distributed feedback in a lateral direction.

28. The semiconductor laser of claim 1, further comprising a grating fabricated above the top reflector, wherein the grating provides a distributed feedback in a lateral direction.

29. The semiconductor laser of claim 3, further comprising:
  d) an absorbing element sitting on top of the top reflector, wherein the absorbing element includes an absorbing region which absorbs light transmitted through the top reflector.

30. The semiconductor laser of claim 3, further comprising:
  d) an absorbing element sandwiched between the substrate and the bottom reflector, wherein the absorbing element includes an absorbing region which absorbs light transmitted through the bottom reflector.

31. The semiconductor laser of claim 3, further comprising:
  d) a phase control element comprising:
    i) a modulating region located above the first p-doped current spreading region, wherein the modulating region uses an electro-optical effect to modulate a wavelength of light;
    ii) a second n-doped current spreading region above the modulating region;
    iii) a second current aperture placed between each neighboring region of the phase control element; and
    iv) a phase control element bias control device between the second n-doped current spreading region and the first p-doped current spreading region such that an electrical field can be created for the modulating region to modulate the wavelength of light.

32. The semiconductor laser of claim 31, wherein the modulating region modulates the wavelength of light when it is exposed to an electric field when a reverse bias is applied.

33. The semiconductor laser of claim 32, further comprising an optical aperture, which allows the generated light to come out of the structure.

34. The semiconductor laser of claim 33, in which the optical aperture is made by partial selective removal of several layers of the top reflector.

35. The semiconductor laser of claim 33, wherein the optical aperture is made by an additional layer located on top of the top reflector.

36. The semiconductor laser of claim 32, further comprising an absorbing element including an absorbing region placed on top of the top reflector to provide a light output in a lateral direction.

37. The semiconductor laser of claim 31, wherein the modulating region modulates the wavelength of light when it is exposed to an injection current when a forward bias is applied.

38. The semiconductor laser of claim 37, further comprising an optical aperture, which allows the generated light to come out of the structure.

39. The semiconductor laser of claim 38, wherein the optical aperture is made by partial selective removal of several layers of the top reflector.

40. The semiconductor laser of claim 38, wherein the optical aperture is made by an additional layer sitting on top of the top reflector.

41. The semiconductor laser of claim 38, further comprising an absorbing element including an absorbing region placed on top of the top reflector to provide a light output in a lateral direction.

42. The semiconductor laser of claim 31, further comprising:
 e) a power modulating element including:
  i) a first absorbing region located above the second n-doped current spreading region, wherein the first absorbing region uses an electro-optical effect to modulate an absorbed power;
  ii) a second p-doped current spreading region above the first absorbing region;
  iii) a third current aperture placed between each neighboring region of the power modulating element; and
  iv) a power modulating element bias control device between the second n-doped current spreading region and the second p-doped current spreading region such that an electrical field can be created that causes the first absorbing region to shift a spectral position of an absorption peak thus modulating an absorption at a given wavelength of the emitted light.

43. The semiconductor laser of claim 42, wherein the first absorbing region is exposed to an electric field when a reverse bias is applied.

44. The semiconductor laser of claim 43, further comprising an optical aperture, which allows the generated light to come out of the structure.

45. The semiconductor laser of claim 43, further comprising an absorbing element including a second absorbing region located on top of the top reflector to provide a light output in a lateral direction.

46. The semiconductor laser of claim 42, wherein the first absorbing region is exposed to an injection current when a forward bias is applied.

47. The semiconductor laser of claim 46, further comprising an optical aperture which allows the generated light to come out of the structure.

48. The semiconductor laser of claim 46, further comprising an absorbing element including a second absorbing region located on top of the top reflector to provide a light output in a lateral direction.

49. The semiconductor laser of claim 3, further comprising
 d) a power modulating element including:
  i) a first absorbing region located above the first p-doped current spreading region, wherein the absorbing region uses an electro-optical effect to modulate an absorbed power;
  ii) a second n-doped current spreading region above the absorbing region;
  iii) a second current apertures placed between each neighboring region of the power modulating element; and
  iv) a power modulating element bias control device between the second n-doped current spreading region and the first p-doped current spreading region such that an electrical field can be created that causes the absorbing region to shift a spectral position of an absorption peak thus modulating an absorption at a given wavelength of light.

50. The semiconductor laser of claim 49, wherein the first absorbing region modulates the absorbed power when it is exposed to an electric field when a reverse bias is applied.

51. The semiconductor laser of claim 50, further comprising an optical aperture, which allows the generated light to come out of the structure.

52. The semiconductor laser of claim 51, herein the optical aperture is made by partial selective removal of several layers of the top reflector.

53. The semiconductor laser of claim 52, wherein the optical aperture is made by an additional layer located on top of the top reflector.

54. The semiconductor laser of claim 50, further comprising an absorbing element including a second absorbing region located on top of the top reflector to provide a light output in a lateral direction.

55. The semiconductor laser of claim 49, wherein the absorbing region is exposed to an injection current when a forward bias is applied.

56. The semiconductor laser of claim 55, further comprising an optical aperture, which allows the generated light to come out of the structure.

57. The semiconductor laser of claim 56, wherein the optical aperture is made by partial selective removal of several layers of the top reflector.

58. The semiconductor laser of claim 56, wherein the optical aperture is made by an additional layer located on top of the top reflector.

59. The semiconductor laser of claim 55, further comprising an absorbing element including a second absorbing region located on top of the top reflector to provide a light output in a lateral direction.

60. The semiconductor laser of claim 1, wherein one reflector is a multi-layered reflector, and the other reflector is a single-layered reflector.

61. The semiconductor laser of claim 60, wherein the bottom reflector is a single-layered reflector, and the top reflector is a multi-layered reflector.

62. The semiconductor laser of claim 61, wherein the tilted optical mode is tilted to the normal to the layers at an angle larger than the angle of the total internal reflection at a boundary between the cavity and the bottom reflector.

63. The semiconductor laser of claim 60, wherein the bottom reflector is a multi-layered reflector, and the top reflector is a single-layered reflector.

64. The semiconductor laser of claim 63, wherein the tilted optical mode is tilted to the normal to the layers at an angle larger than the angle of the total internal reflection at a boundary between the cavity and the top reflector.

65. The semiconductor laser of claim 3, wherein the active region is located at a local maximum of intensity of the resonant tilted optical mode.

66. The semiconductor laser of claim 31, wherein the modulating region is located at a local maximum of intensity of the resonant tilted optical mode.

67. The semiconductor laser of claim 31, wherein both the active region and the modulating region are located at local maxima of intensity of the resonant tilted optical mode.

68. The semiconductor laser of claim 49, wherein the absorbing region is placed at a local maximum of intensity of the resonant tilted optical mode.

69. The semiconductor laser of claim 49, wherein both the active region and the absorbing region are placed at local maxima of intensity of the resonant tilted optical mode.

70. The semiconductor laser of claim 42, wherein the active region, the modulating region, and the absorbing region are placed at local maxima of intensity of the resonant tilted optical mode.

71. The semiconductor laser of claim 3, wherein the cavity further comprises:

vii) a modulating region placed above the first p-doped current spreading region; and viii) a second current aperture placed between the first p-doped current spreading region and the modulating region.

72. The semiconductor laser of claim 71, wherein the modulating region comprises a modulating layer exhibiting an absorption peak in a spectral region close to a spectral line of generated light.

73. The semiconductor laser of claim 72, wherein the modulating layer is designed such that a resonance decrease of its refractive index with an increase in temperature compensates an average non-resonant increase of an effective refractive index of the cavity thus providing an additional stabilization of a linewidth of emitted light against temperature variations.

74. The semiconductor laser of claim 73, wherein the modulating layer is placed at a local maximum of the resonant tilted optical mode.

75. The semiconductor laser of claim 73, wherein both the active region and the modulating layer are placed at local maxima of the resonant tilted optical mode.

76. The semiconductor laser of claim 1, wherein only a part of the laser structure is formed from a tilted cavity.

77. The semiconductor laser of claim 1, wherein at least one side surface of the tilted cavity is covered by a coating selected from the group consisting of a single-layer coating; and a multiple-layer coating;

wherein the coating controls a light output in the lateral direction.

78. The semiconductor laser of claim 1, wherein at least one optical fiber is attached in a near field zone of an electromagnetic field in a vicinity of a side surface of the cavity thus providing coupling of a resonant optical mode of the cavity to the optical fiber.

79. The semiconductor laser of claim 1, wherein at least one optical fiber is attached in a near field zone of an electromagnetic field in a vicinity of a top surface of the top reflector, thus providing coupling of a resonant optical mode of the cavity to the optical fiber.

80. The semiconductor laser of claim 1, wherein at least one optical fiber is attached in a near field zone of an electromagnetic field on top of a top surface of the top reflector, thus providing coupling of a resonant optical mode of the cavity to the optical fiber.

81. The semiconductor laser of claim 1, wherein at least one reflector selected from the group consisting of the bottom reflector and the top reflector is a multilayered reflector.

* * * * *